US012577900B2

(12) United States Patent
Kochendoerfer et al.

(10) Patent No.: US 12,577,900 B2
(45) Date of Patent: Mar. 17, 2026

(54) RECOVERY OF ENERGY

(71) Applicant: BASF SE, Ludwigshafen am Rhein (DE)

(72) Inventors: Kiara Aenne Kochendoerfer, Ludwigshafen am Rhein (DE); Eric Jenne, Ludwigshafen am Rhein (DE); Andrey Shustov, Ludwigshafen am Rhein (DE)

(73) Assignee: BASF SE, Ludwigshafen am Rhein (DE)

( * ) Notice: Subject to any disclaimer, the term of this patent is extended or adjusted under 35 U.S.C. 154(b) by 0 days.

(21) Appl. No.: 18/836,488

(22) PCT Filed: Feb. 8, 2023

(86) PCT No.: PCT/EP2023/053074
§ 371 (c)(1),
(2) Date: Aug. 7, 2024

(87) PCT Pub. No.: WO2023/152162
PCT Pub. Date: Aug. 17, 2023

(65) Prior Publication Data
US 2025/0137396 A1 May 1, 2025

(30) Foreign Application Priority Data
Feb. 9, 2022 (EP) ..................................... 22155975

(51) Int. Cl.
*F01N 5/02* (2006.01)
*B01J 19/00* (2006.01)
(Continued)

(52) U.S. Cl.
CPC .......... *F01N 5/025* (2013.01); *B01J 19/0013* (2013.01); *B01J 19/2425* (2013.01);
(Continued)

(58) Field of Classification Search
CPC ....... F01N 5/025; F01N 3/2013; H10N 10/10; H10N 10/13; H10N 10/17; B01J 19/0013;
(Continued)

(56) References Cited

U.S. PATENT DOCUMENTS 3,881,962 A 5/1975 Rubinstein
4,361,478 A 11/1982 Gengler et al.
(Continued)

FOREIGN PATENT DOCUMENTS

CN 106953548 A 7/2017
EP 0245839 A1 11/1987
(Continued)

OTHER PUBLICATIONS

International Search Report and Written Opinion received for PCT Patent Application No. PCT/EP2023/053074, mailed on Apr. 5, 2023, 21 pages (11 pages of English Translation and 10 pages of Original Document).
(Continued)

*Primary Examiner* — Mark A Laurenzi
*Assistant Examiner* — Kelsey L Stanek
(74) *Attorney, Agent, or Firm* — Faegre Drinker Biddle & Reath LLP

(57) ABSTRACT

The invention proposes an apparatus (110) comprising a multitude of tubes. At least one of the tubes is set up as a reaction tube (112) for at least one feedstock to flow through.
(Continued)

The apparatus (110) has at least one energy recovery shell (130) at least partly surrounding the reaction tube (112). The energy recovery shell (130) has at least one thermoelectric generator set up to convert heat to electrical energy.

18 Claims, 22 Drawing Sheets

(51) Int. Cl.
    B01J 19/24       (2006.01)
    F01N 3/20        (2006.01)
    H10N 10/10      (2023.01)

(52) U.S. Cl.
    CPC ........... F01N 3/2013 (2013.01); H10N 10/10 (2023.02); B01J 2208/00212 (2013.01); B01J 2219/00094 (2013.01); B01J 2219/00099 (2013.01)

(58) Field of Classification Search
    CPC .......... B01J 19/2425; B01J 2208/00212; B01J 2219/00094; B01J 2219/00099; B01J 2219/00137; B01J 2219/00135; C01B 3/02; C01B 3/22–48; F28D 7/1607; F28D 7/10
    USPC ..................................... 60/320; 48/61–214 A
    See application file for complete search history.

(56)              References Cited

U.S. PATENT DOCUMENTS

| | | | | |
|---|---|---|---|---|
| 5,413,767 A * | 5/1995 | Breuer | ................ | F01N 13/0097 |
| | | | | 422/177 |
| 8,656,710 B2 * | 2/2014 | Bell | ........................ | F28D 7/106 |
| | | | | 60/275 |
| 2011/0146743 A1 * | 6/2011 | Oesterle | ................ | H10N 10/17 |
| | | | | 136/201 |
| 2014/0238459 A1 | 8/2014 | Moors et al. | | |
| 2016/0233403 A1 * | 8/2016 | Bell | ........................ | H10N 10/00 |

FOREIGN PATENT DOCUMENTS

| | | | |
|---|---|---|---|
| EP | 2653524 A1 | 10/2013 | |
| EP | 3151293 A1 | 4/2017 | |
| EP | 3415587 A1 | 12/2018 | |
| JP | 06-154589 A | 6/1994 | |
| JP | 2002-171776 A | 6/2002 | |
| JP | 2008-032341 A | 2/2008 | |
| KR | 10-2019-0040433 A | 4/2019 | |
| WO | 2015/197181 A1 | 12/2015 | |
| WO | 2020/035574 A1 | 2/2020 | |
| WO | 2020/035575 A1 | 2/2020 | |
| WO | 2022/069726 A1 | 4/2022 | |

OTHER PUBLICATIONS

International Preliminary Report on Patentability received for PCT Patent Application No. PCT/EP2023/053074, mailed on Aug. 22, 2024, 18 pages (12 pages of English Translation and 6 pages of Original Document).

Zhang et al., "Performance comparison of annular and flat-plate thermoelectric generators for cylindrical hot source", Energy Reports, vol. 7, No. 1, 2021, pp. 413-420.

Zimmermann et al., "Ethylene", Wiley, vol. 13, No. 1, 2012, pp. 1-66.

\* cited by examiner

RECOVERY OF ENERGY

CROSS-REFERENCE TO RELATED APPLICATIONS

This application is a National stage application (under 35 U.S.C. § 371) of PCT/EP2023/053074, filed Feb. 8, 2023, which claims benefit of European Application No. 22155975.0, filed Feb. 9, 2022, both of which are incorporated herein by reference in their entirety.

The invention relates to an apparatus comprising a multitude of hollow cylindrical tubes, to a plant and to a method of recovering electrical energy.

The apparatus may be part of a plant, for example a plant for performance of at least one endothermic reaction, a plant for heating, a plant for preheating, a steamcracker, a steam reformer, an apparatus for alkane dehydrogenation, a reformer, an apparatus for dry reforming, an apparatus for styrene production, an apparatus for ethylbenzene dehydrogenation, a cracker, a catalytic cracker, production of acetylene and an apparatus for dehydrogenation. The apparatus may especially be used for heating of feedstock to a temperature in the range from 200° C. to 1700° C., preferably from 300° C. to 1400° C., more preferably from 400° C. to 875° C. However, other fields of use are also conceivable.

Production plants such as steamcrackers are fundamentally known to the person skilled in the art; see, for example, Ethylene; Heinz Zimmermann, Roland Walzl; Ullmann's Encyclopedia of Industrial Chemistry (15 Apr. 2009). In steamcrackers, for example, crude gasoline (naphtha) is split at high temperatures into ethylene and propylene in the presence of steam. In what is called a convection zone of the steamcracker, the crude gasoline is preheated for this purpose, and hot steam is added. In a downstream radiation zone, at about 850° C., the crude gasoline is split into ethylene and propylene, i.e. cracked. The steamcracker is conventionally heated by combustion of natural gas, which is associated with carbon emissions. The heat evolved in the combustion of natural gas is used in conventional steamcrackers not just for cracking; the waste heat ascending within the chimney is also used for preheating of the crude gasoline in the convection zone. Such conventional production plants are known, for example, from EP 2 653 524 A1, U.S. Pat. No. 4,361,478 A, EP 0 245 839 A1 or EP3415587A1.

Also known are electrically heatable reactors, for example from WO 2015/197181 A1, WO 2020/035575 A1, and WO 2020/035574 A1, the contents of which are hereby incorporated by reference. Electrically heatable reactors can enable $CO_2$-neutral operation of the reactor. Thermal integration for an electrically heatable reactor is known from PCT/EP2021/077144, filed Oct. 1, 2021, the contents of which are hereby incorporated by reference.

U.S. Pat. No. 3,881,962 A describes a generator of the thermoelectric type, which isolates the fuel combustion region from a number of thermoelectric elements or modules and uses biphasic vapor heat transfer, in which transfer takes place from a liquid phase to a gaseous phase via the intervening presence of a boiler accommodating a fuel burner. The fuel consumed in the boiler generates heat, which meets a shell of the boiler enclosing an evaporable fluid. The heated steam thus generated flows through a number of heat exchange loops that emanate from the boiler, in order to heat the hot connection sites of the thermoelectric elements. The electrical energy is generated by a potential that evolves between the hot and cold connection sites of the elements mentioned.

JP H06 154589 A describes an insulated vessel equipped with: a device that heats or cools the main body of the vessel; a device that feeds a heat exchange fluid into the vessel in order to control the temperature within the vessel and to guide the exchange of heat between the heat exchange fluid and the atmosphere in the vessel; a thermoelectric device that converts the thermal energy obtained by the heat exchange with the heat exchange fluid which is diverted out of the vessel after the exchange of heat to electrical energy; a device that stores the electrical energy generated by the device.

Energy is required for operation of conventional and also electrically heatable reactors. Recovery of energy is a continuing problem.

It is therefore an object of the present invention to provide an apparatus, a plant and a method for recovery of electrical energy, which at least largely avoid the disadvantages of known apparatuses and methods. In particular, recovery of energy is to be enabled.

This object is achieved by an apparatus, a plant and a method having the features of the independent claims. Preferred configurations of the invention are specified inter alia in the associated subsidiary claims and dependency references of the subsidiary claims.

The expressions "have", "comprise" or "include" or any grammatical variations thereof are used hereinafter in a non-exclusive manner. Accordingly, these expressions may relate either to situations in which there are no further features apart from the feature introduced by these expressions or to situations in which there is or are one or more further features. For example, the expression "A has B", "A comprises B" or "A includes B" may relate both to the situation in which, apart from B, there is no further element in A (i.e. to a situation in which A exclusively consists of B) and to the situation in which, in addition to B, there is or are one or more further elements in A, for example element C, elements C and D or even further elements.

It is also pointed out that the expressions "at least one" and "one or more" and grammatical variations of these expressions or similar expressions, when these are used in connection with one or more elements or features and are intended to express that the element or feature may be provided one or more times, are generally used only once, for example when the feature or element is introduced for the first time. When the feature or element is subsequently mentioned again, the corresponding expression "at least one" or "one or more" is generally no longer used, without restricting the possibility that the feature or element may be provided one or more times.

Furthermore, the expressions "preferably", "in particular", "for example" or similar expressions are used hereinafter in conjunction with optional features, without restriction of alternative embodiments thereby. Thus, features that are introduced by these expressions are optional features, and there is no intention to restrict the scope of protection of the claims, and in particular of the independent claims, by these features. Thus, as a person skilled in the art will appreciate, the invention may also be carried out using other configurations. In a similar way, features that are introduced by "in one embodiment of the invention" or by "in one example of the invention" are understood as optional features, without any intention that alternative configurations or the scope of protection of the independent claims be restricted thereby. Furthermore, all the possible combinations of the features thereby introduced with other features, whether optional or non-optional features, shall remain unaffected by these introductory expressions.

In a first aspect of the present invention, an apparatus comprising a multitude of tubes is proposed. At least one of the tubes is set up as a reaction tube for at least one feedstock to flow through. The apparatus has at least one energy recovery shell at least partly surrounding the reaction tube. The energy recovery shell has at least one thermoelectric generator set up to convert heat to electrical energy.

The apparatus may be usable, and the method described further down employable, in a plant selected from the group consisting of: a plant for performance of at least one endothermic reaction, a plant for heating, a plant for pre-heating, a steamcracker, a steam reformer, an apparatus for alkane dehydrogenation, a reformer, an apparatus for dry reforming, an apparatus for styrene production, an apparatus for ethylbenzene dehydrogenation, production of acetylene, a cracker, a catalytic cracker, an apparatus for dehydrogenation.

The expression "tube" as used here is a broad expression that should be attributed its usual and common meaning as understood by a person skilled in the art. This expression is not restricted to a specific or adapted meaning. This expression may, without restriction, refer in particular to an arbitrarily shaped hollow body. A length of the tube may be greater than its diameter. The tube may have an interior delimited from an outer environment by a shell surface. The tube may be configured as a tube through which a flow can pass, also referred to as a flow tube. The tube may comprise at least one pipeline and/or at least one pipeline segment and/or at least one pipeline coil. A pipeline segment may be a subregion of a pipeline. The expressions "tube", "pipeline" and "pipeline segment" and "pipeline coil" are used as synonyms hereinafter.

For example, the tube may be a hollow cylindrical tube. The expression "hollow cylindrical tube" as used here is a broad expression that should be attributed its usual and common meaning as understood by a person skilled in the art. This expression is not restricted to a specific or adapted meaning. This expression may, without restriction, refer in particular to a tube having an at least partly cylindrical section. The tube may be of fully cylindrical configuration or else have noncylindrical sections. The hollow cylindrical tube may, for example, be a circular cylinder with radius r and a length h, also referred to as height. The circular cylinder may have a bore along an axis. Variances from a circular cylinder geometry are also conceivable. For example, the tube may have an elliptical cross-sectional area. For example, the tube may have a prismatic geometry. For example, at least one of the tubes of the apparatus may have a rectangular geometry.

The apparatus comprises a multitude of tubes. The reaction tube may be surrounded by further tubes. The tubes may be in a concentric arrangement. The reaction tube may be arranged as a central tube surrounded by the further tubes. The apparatus may have a multipart configuration, for example with an M-, U- or W-shaped coil as reaction tube and mounting of the further tubes on straight sections of the same length.

The expression "feedstock" as used here is a broad expression that should be attributed its usual and common meaning as understood by a person skilled in the art. This expression is not restricted to a specific or adapted meaning. This expression may, without restriction, refer in particular to basically any free-flowing medium. The feedstock may be liquid or gaseous. The feedstock may include at least one medium selected from the group consisting of: air, at least one oxygen-containing medium, water, water vapor, and at least one oxidizing medium. Other feedstocks are also conceivable.

A number of side reactions occur in the above-listed plants for performance of at least one endothermic reaction, and these can lead, for example, to coking of plant components, especially the reaction tubes. It is therefore customary, for example at fixed or regular intervals, to conduct exothermic reactions to burn off the coking, especially what is called decoking of the plant. In the case of decoking, the feedstock, also referred to as decoking gas, can be fed into the reaction tube and the coking can be burnt off at least one exothermic reaction.

The expression "flow through" as used here is a broad expression that should be attributed its usual and common meaning as understood by a person skilled in the art. This expression is not restricted to a specific or adapted meaning. This expression may, without restriction, relate more particularly to one or more of accommodation of the feedstock in the reaction tube, flow of the feedstock through the reaction tube, conduction of the feedstock, transport of the feedstock, for example from a first end of the reaction tube to a second end of the reaction tube.

The expression "reaction tube" as used here is a broad expression that should be attributed its usual and common meaning as understood by a person skilled in the art. This expression is not restricted to a specific or adapted meaning. This expression may, without restriction, refer in particular to a tube set up for the feedstock to flow through it. The reaction tube may be set up to allow at least one chemical reaction, and/or a subreaction, to proceed in the reaction tube. In particular, the reaction tube is set up for at least one feedstock to flow through it in order to perform at least one endothermic reaction. For example, at least one endothermic reaction can be effected in the reaction tube. For example, an exothermic reaction for decoking and/or oxidation of the deposit formed in the endothermic reaction can be conducted in the reaction tube.

The reaction tube may be set up, for example, to heat the feedstock. The reaction tube may be a reactor and/or a furnace or a portion thereof. For example, the reaction tube may be configured as a reactor of a combustion furnace and/or of an electrically heatable reactor. For example, the reaction tube may be configured as a reactor of a combustion furnace, as described, for example, in H. Zimmermann and R. Walzl, "Ethylene", Ullmann's Encyclopedia of Industrial Chemistry, 2012 Wiley-VCH Verlag Gmbh & Co. KGaA, Weinheim, DOI: 10.1002/14356007.a10_045.pub3, EP 2 653 524 A1, U.S. Pat. No. 4,361,478 A, EP 0 245 839 A1 or EP3415587A1. For example, the reaction tube may be configured as an electrically heatable reactor, as described, for example, in WO 2015/197181 A1, WO 2020/035575 A1, and WO 2020/035574 A1.

The geometry and/or surfaces and/or material of the reaction tube may be dependent on the feedstock. Alternatively or additionally, geometry and/or surfaces and/or material of the reaction tube may be dependent on a desired reaction and/or avoidance of a particular reaction and/or optimization of the reaction and/or other factors. For example, the reaction tube may be configured as a hollow cylinder.

The apparatus may comprise a multitude of reaction tubes. The apparatus may have I reaction tubes, where I is a natural number greater than or equal to two. For example, the apparatus may comprise at least two, three, four, five or more reaction tubes. The apparatus may have, for example, up to one hundred reaction tubes. The reaction tubes may be of identical or different configuration. The reaction tubes may be of different configuration, for example, with regard to diameter and/or length and/or geometry. The reaction tubes may comprise symmetric and/or asymmetric pipes and/or combinations thereof. In a purely symmetrical configuration, the apparatus may comprise reaction tubes of an identical tube type. "Asymmetric pipes" and "combinations of symmetric and asymmetric pipes" may be considered to mean that the apparatus may comprise any combination of tube types, which may, for example, additionally be connected as desired in parallel or in series. The expression "tube type" as used here is a broad expression that should be attributed its usual and common meaning as understood by a person skilled in the art. This expression is not restricted to a specific or adapted meaning. This expression may, without restriction, relate more particularly to a category or type of tube characterized by particular features. The tube type may be characterized at least by one feature selected from the group consisting of: a horizontal configuration of the tube; a vertical configuration of the tube; a length in the inlet (I1) and/or outlet (I2) and/or transition (I3); a diameter in the inlet (d1) and outlet (d2) and/or transition (d3); number n of passes; length per pass; diameter per pass; geometry; surface; and material. The apparatus may comprise a combination of at least two different tube types which are connected in parallel and/or in series. For example, the apparatus may comprise tubes of different lengths in the inlet (I1) and/or outlet (I2) and/or transition (I3). For example, the apparatus may comprise tubes with an asymmetry of the diameters in the inlet (d1) and/or outlet (d2) and/or transition (d3). For example, the apparatus may comprise tubes with a different number of passes. For example, the apparatus may comprise tubes with passes with different lengths per pass and/or different diameters per pass. In principle, any combination of any tube types in parallel and/or in series is conceivable. The apparatus may comprise a multitude of inlets and/or outlets and/or production streams. The reaction tubes of different or identical tube types may be arranged in parallel and/or in series with a multitude of inlets and/or outlets. Possible tubes for reaction tubes may take the form of various tube types in the form of a construction kit and may be selected and combined as desired, depending on an end use. Use of tubes of different tube types can enable more accurate temperature control and/or adjustment of the reaction when the feed is fluctuating and/or a selective yield of the reaction and/or an optimized methodology. The tubes may comprise identical or different geometries and/or surfaces and/or materials.

The reaction tubes may be through-connected and hence form a tube system. The expression "tube system", as used here, is a broad expression that should be attributed its usual and common meaning as understood by a person skilled in the art. This expression is not restricted to a specific or adapted meaning. This expression may, without restriction, refer in particular to an apparatus composed of at least two tubes that are especially connected to one another. The tube system may comprise incoming and outgoing tubes. The tube system may comprise at least one inlet for receiving the feedstock. The tube system may comprise at least one outlet for discharging the feedstock. "Through-connected" may be understood to mean that the tubes are interconnected in a fluid-conducting manner. Thus, the tubes may be arranged and connected in such a way that the feedstock flows through the tubes one after another. Two or more or all of the tubes may be configured in series and/or in parallel. The tubes may be interconnected parallel to one another in such a way that the feedstock can flow through at least two tubes in parallel. The tubes, in particular the tubes connected in parallel, may be designed in such a way as to transport different feedstocks in parallel. In particular, the tubes connected in parallel may have mutually different geometries and/or surfaces and/or materials for transport of different feedstocks. For the transport of a feedstock in particular, a number or all of the tubes may be in parallel configuration, such that the feedstock can be divided among those tubes in parallel configuration. There are also conceivable combinations of a series connection and a parallel connection.

The reaction tube may be an electrically conductive, especially metallic, or electrically nonconductive reaction tube.

For example, the reaction tube may be an electrically conductive reaction tube. The expression "electrically conductive", as used here, is a broad expression that should be attributed its usual and common meaning as understood by a person skilled in the art. This expression is not restricted to a specific or adapted meaning. This expression may, without restriction, refer in particular to a material of the reaction tube that is set up to conduct electrical current. The reaction tube may have a specific electrical resistivity of less than $10^{-1}$ $\Omega$m. The reaction tube may have a specific electrical resistivity $\rho$ of $1 \cdot 10^{-8}$ $\Omega m \leq \rho \leq 10^{-1}$ $\Omega$m. Specific electrical resistivity in the context of the present invention relates to specific electrical resistivity at room temperature. For example, the reaction tube may include at least one material selected from the group consisting of: at least one ferritic material, at least one austenitic material, at least one metal, at least one metallic alloy, copper, aluminum, iron, steel alloy, Cr alloy and/or Ni alloy, graphite, carbon, carbide, silicide.

The reaction tubes and correspondingly incoming and outgoing pipelines may be fluidically connected to one another. In the case of use of electrically conductive tubes as reaction tube, the incoming and outgoing pipelines may be galvanically isolated from one another. "Galvanically isolated from one another" may be considered to mean that the pipelines and the incoming and outgoing pipelines are isolated from one another in such a way that there is no electrical conduction and/or tolerable electrical conduction between the pipelines and the incoming and outgoing pipelines. The apparatus may comprise at least one insulator, in particular a multitude of insulators. Galvanic isolation between the respective pipelines and the incoming and outgoing pipelines can be ensured by the insulators. The insulators can ensure free flow of the feedstock.

However, configurations of the reaction tube as electrically nonconductive tubes or poorly conductive tubes are also conceivable; for example, the reaction tube may be manufactured from a ceramic or materials having similar specific resistivity. The reaction tube may be configured as a galvanic insulator. The reaction tube may have a specific electrical resistivity of more than $10^5 \Omega$m. The reaction tube may have a specific electrical resistivity $\rho$ of $1 \times 10^5$ $\Omega m \leq \rho \leq 1 \times 10^{20}$ $\Omega$m, preferably of $1 \times 10^5$ $\Omega m \leq \rho \leq 1 \times 10^{14}$ $\Omega$m. For example, the reaction tube may be configured as a ceramic tube. For example, the reaction tube may include at least one material selected from the group consisting of: MgO, $Al_2O_3$, boron nitride, aluminum nitride, aluminum silicate (mullite), $ZrO_2$, magnesium aluminum silicate (cordierite), magnesium silicate (steatite), silicon nitride.

The expression "shell", as used here, is a broad expression that should be attributed its usual and common meaning as understood by a person skilled in the art. This expression is not restricted to a specific or adapted meaning. This expression may, without restriction, refer in particular to an element or a multitude of elements that form(s) a two-dimensional and complete or partial boundary between an inner region and an outer region. The shell may be a casing. The shell may be configured one or more of a tube, a thin film, a covering or a layer, which at least partly surrounds and/or encloses a further element of the apparatus. The expressions "surround" and "enclose" are used here as synonyms. The shell may fulfill various functions, for example heating, cooling, conducting current, galvanically insulating, or others.

For example, the apparatus may comprise at least one heating shell. The apparatus may have at least one power source or voltage source set up to generate an electrical current in the heating shell that heats the reaction tube by means of Joule heat that arises on passage of the electrical current through the heating shell. The expression "heating shell", as used here, is a broad expression that should be attributed its usual and common meaning as understood by a person skilled in the art. This expression is not restricted to a specific or adapted meaning. This expression may, without restriction, refer in particular to a shell set up to transfer energy supplied to it to the reaction tube in the form of heat. The heating shell may at least partly surround the reaction tube. The geometry and/or material of the heating shell may be matched to the reaction tube to be heated. For instance, energy-efficient heating of the reaction tube may be possible.

The heating shell may include at least one material selected from the group consisting of ferritic and austenitic materials, for example CrNi alloy, CrMo or ceramic. For example, the heating shell may have been produced from at least one metal and/or at least one alloy, such as copper, aluminum, iron, steel or Cr or Ni alloys, graphite, carbon, carbides, silicides. Semiconductors are also conceivable as material for the heating shell, for example Ge, Si, selenides, tellurides, arsenides, antimonide.

The heating shell may be a current-conducting heating shell. The expression "current-conducting heating shell", as used here, is a broad expression that should be attributed its usual and common meaning as understood by a person skilled in the art. This expression is not restricted to suitability of the heating shell, in particular of at least one material of the heating shell that is set up to conduct an electrical current. The heating shell, especially with a connected power source or voltage source, may have a specific electrical resistivity $\rho$ of $1\times10^{-8}$ $\Omega m \leq \rho \leq 10^5 \Omega m$. The heating shell may have a thermal conductivity A of 10 W/(mK) $\leq\lambda\leq6000$ W/(mK), preferably of 20 W/(mK)$\leq\lambda\leq5000$ W/(mK). Thermal conductivity in the context of the present invention relates to thermal conductivity at room temperature. The heating shell may be thermally stable within a range of up to 2000° C., preferably up to 1300° C., more preferably up to 1000° C. The expression "thermally stable", as used here, is a broad expression that should be attributed its usual and common meaning as understood by a person skilled in the art. This expression is not restricted to a specific or adapted meaning. This expression may, without restriction, relate in particular to resistance of the heating shell, especially of a material of the heating shell, versus high temperatures in particular.

As set out above, the apparatus may have at least one power source or at least one voltage source set up to generate an electrical current in the heating shell that heats the reaction tube by means of Joule heat that arises on passage of the electrical current through the heating shell. The power source and/or the voltage source may comprise a single-phase or multiphase AC power source and/or single-phase or multiphase AC voltage source, or a DC power source and/or DC voltage source. The apparatus may have at least one input and output that electrically connects the power source and/or voltage source to the heating shell.

The apparatus may have, for example, at least one AC power source and/or at least one AC voltage source. The AC power source and/or an AC voltage source may be a single-phase or multiphase source. The expression "AC power source", as used here, is a broad expression that should be attributed its usual and common meaning as understood by a person skilled in the art. This expression is not restricted to a specific or adapted meaning. This expression may, without restriction, refer in particular to a power source set up to provide an AC current. The expression "AC current", as used here, is a broad expression that should be attributed its usual and common meaning as understood by a person skilled in the art. This expression is not restricted to a specific or adapted meaning. This expression may, without restriction, refer in particular to an electrical current of a polarity that changes in a regular repetition. For example, the alternating current may be a sinusoidal alternating current. The expression "single-phase", as used here, is a broad expression that should be attributed its usual and common meaning as understood by a person skilled in the art. This expression is not restricted to a specific or adapted meaning. This expression may, without restriction, refer in particular to an AC power source that provides an electrical current with a single phase. The expression "multiphase", as used here, is a broad expression that should be attributed its usual and common meaning as understood by a person skilled in the art. This expression is not restricted to a specific or adapted meaning. This expression may, without restriction, refer in particular to an AC power source that provides an electrical current with more than one phase. The expression "AC voltage source", as used here, is a broad expression that should be attributed its usual and common meaning as understood by a person skilled in the art. This expression is not restricted to a specific or adapted meaning. This expression may, without restriction, refer in particular to a voltage source set up to provide an AC voltage. The expression "AC voltage", as used here, is a broad expression that should be attributed its usual and common meaning as understood by a person skilled in the art. This expression is not restricted to a specific or adapted meaning. The expression may, without restriction, refer in particular to a voltage having a level and polarity that change in a regular repetition. For example, the AC voltage may be a sinusoidal AC voltage. The voltage generated by the AC voltage source causes a current to flow, in particular an alternating current to flow. A "single-phase" AC voltage source may be considered to mean an AC voltage source which provides the alternating current with a single phase. A "multiphase" AC voltage source may be considered to mean an AC voltage source which provides the alternating current with more than one phase.

The apparatus may have at least one DC power source and/or at least one DC voltage source. The expression "DC power source", as used here, is a broad expression that should be attributed its usual and common meaning as understood by a person skilled in the art. This expression is not restricted to a specific or adapted meaning. This expression may, without restriction, refer in particular to an apparatus set up to provide a DC current. The expression "DC voltage source", as used here, is a broad expression that should be attributed its usual and common meaning as understood by a person skilled in the art. This expression is not restricted to a specific or adapted meaning. This expression may, without restriction, refer in particular to an apparatus set up to provide a DC voltage. The DC power source and/or DC voltage source may be set up to generate a DC current in the heating shell. The expression "DC current", as used here, is a broad expression that should be attributed its usual and common meaning as understood by a person skilled in the art. This expression is not restricted to a specific or adapted meaning. This expression may, without restriction, refer in particular to an essentially constant electrical current in expressions of intensity and direction. The expression "DC voltage", as used here, is a broad expression that should be attributed its usual and common meaning as understood by a person skilled in the art. This expression is not restricted to a specific or adapted meaning. This expression may, without restriction, refer in particular to an essentially constant electrical voltage. "Essentially constant" may be considered to mean a current or a voltage having variations that are immaterial in respect of the intended effect.

The apparatus may have a multitude of heating zones. For example, the apparatus may have two or more heating zones. Each heating zone may comprise at least one heating shell. The apparatus may also have regions in which there is no heating of the feedstock, for example mere transport zones.

The apparatus may have a multitude of power sources and/or voltage sources, said power sources and/or voltage sources being selected from the group consisting of: single-phase or multiphase AC power sources and/or single-phase or multiphase AC voltage sources or DC power sources and/or DC voltage sources, and a combination thereof. The apparatus may have 2 to M different power sources and/or voltage sources, where M is a natural number not less than three. The power sources and/or voltage sources may be configured with or without the possibility of controlling at least one electrical output variable. The power sources and/or voltage sources may be electrically controllable independently of one another. The power sources and/or voltage sources may be of identical or different configuration. For example, the apparatus may be set up such that current and/or voltage are adjustable for different zones, especially heating zones of the apparatus, especially the heating shell. The apparatus may have a multitude of reaction tubes. Reaction tubes may share a common heating shell or each have an assigned heating shell. The reaction tubes may belong to different temperature regions or zones. The reaction tubes themselves may likewise have temperature zones. The individual reaction tubes may be assigned one or more power sources or voltage sources. The power supply and/or voltage supply may, for example, be adjusted by use of at least one controller, in each case depending on the reaction and methodology. Using a multitude of power sources and/or voltage sources allows the voltage in particular to be varied for different zones. For instance, it is possible to achieve not too high a current, which would result in excessively hot reaction tubes or, conversely, excessively cold reaction tubes.

The apparatus may have a multitude of single-phase or multiphase AC power sources or AC voltage sources. The reaction tubes may each be assigned at least one heating shell with at least one AC power source and/or AC voltage source connected to the heating shell, especially electrically via at least one electrical connection. Also conceivable are embodiments in which at least two reaction tubes share a heating shell and an AC power source and/or AC voltage source. For connection of the AC power source or AC voltage source and the heating shell, the apparatus may have 2 to N inputs and outputs where N is a natural number not less than three. The respective AC power source and/or AC voltage source may be set up to generate an electrical current in the respective heating shell. The AC power sources and/or AC voltage sources may either be controlled or uncontrolled. The AC power sources and/or AC voltage sources may be configured with or without the possibility of controlling at least one electrical output variable. The expression "output variable", as used here, is a broad expression that should be attributed its usual and common meaning as understood by a person skilled in the art. This expression is not restricted to a specific or adapted meaning. This expression may, without restriction, relate in particular to a current value and/or a voltage value and/or a current signal and/or a voltage signal. The apparatus may have 2 to M different AC power sources and/or AC voltage sources where M is a natural number not less than three. The AC power sources and/or AC voltage sources may be independently electrically controllable. For example, a different current may be generated in the respective heating shell and different temperatures reached in the reaction tubes.

The apparatus may comprise a multitude of DC power sources and/or DC voltage sources. Each reaction tube may be assigned at least one heating shell and at least one DC power source and/or DC voltage source connected to the heating shell, especially electrically via at least one electrical connection. Also conceivable are embodiments in which at least two reaction tubes share a heating shell and a DC power source and/or DC voltage source. For connection of the DC power sources and/or DC voltage sources and the heating cylinder, the apparatus may have 2 to N positive terminals and/or conductors and 2 to N negative terminals and/or conductors, where N is a natural number not less than three. The respective DC power sources and/or DC voltage sources may be set up to generate an electrical current in the respective heating shell. The current generated can heat the respective reaction tube by Joule heat that arises on passage of the electrical current through the heating shell, in order to heat the feedstock.

The current generated in the heating shell can heat the respective reaction tube by Joule heat that arises on passage of the electrical current through the heating shell, in order to heat the feedstock. The expression "heating the reaction tube" as used here is a broad expression that should be attributed its usual and common meaning as understood by a person skilled in the art. This expression is not restricted to a specific or adapted meaning. This expression may, without restriction, refer in particular to an operation that leads to a change in a temperature of the reaction tube, especially a rise in the temperature of the reaction tube, and/or has the effect that the temperature of the reaction tube remains essentially constant, for example when the reaction that takes place in the reaction tube consumes as much heat as it receives. The expressions "heating" and "warming" are used as synonyms. The feedstock may, for example, be heated to a defined or predetermined temperature value. The apparatus may be set up to heat the feedstock to a temperature in the range from 200° C. to 1700° C., preferably 300° C. to 1400° C., more preferably 400° C. to 875° C. However, other temperatures and temperature ranges are also conceivable.

The reaction tube may be set up to at least partly absorb the Joule heat generated by the heating shell and to at least partly release it to the feedstock. For example, at least one endothermic reaction can be effected in the reaction tube. The expression "endothermic reaction", as used here, is a broad expression that should be attributed its usual and common meaning as understood by a person skilled in the art. This expression is not restricted to a specific or adapted meaning. This expression may, without restriction, refer in particular to a reaction in which energy, especially in the form of heat, is consumed from the environment. The endothermic reaction may comprise heating and/or preheating of the feedstock. In particular, the feedstock may be heated in the reaction tube.

The apparatus may have at least one temperature sensor set up to determine, especially to measure, a temperature of the reaction tube. The temperature sensor may comprise an electrical or electronic element set up to generate an electrical signal as a function of temperature. For example, the temperature sensor may have at least one element selected from the group consisting of: a high-temperature conductor, a low-temperature conductor, a semiconductor temperature sensor, a temperature sensor with an oscillating crystal, a thermocouple, a pyroelectric material, a pyrometer, a thermal imaging camera, a ferromagnetic temperature sensor, a fiber-optical temperature sensor. The temperature may be measured at the inlet and outlet of the reaction tube in and/or on the reaction tube. For example, it is possible to make measurements at several points in the reaction tube in order to determine the temperature over the length of the reaction tube and to match it to an optimal process regime. Closed-loop control in respect of temperature can be effected by means of at least one closed-loop control element. This can switch off the supply of power or voltage, for example, in the event of a hotspot. When the temperature is too low, the closed-loop control can increase the supply of power or voltage. The temperature sensor may be connected to the closed-loop controller by a remote connection or a fixed connection. The closed-loop controller may be connected to the power source or voltage source by a remote connection or a fixed connection. Temperature measurement and closed-loop control may be possible in what is called the "closed-loop mode" by means of installed temperature sensors and closed-loop current and/or voltage control.

The apparatus may have at least one control unit set up to control the power source or voltage source by closed-loop control as a function of a temperature measured by the temperature sensor. The expression "control unit", as used here, is a broad expression that should be attributed its usual and common meaning as understood by a person skilled in the art. This expression is not restricted to a specific or adapted meaning. The expression may, without restriction, refer in particular to an electronic device set up to control at least one element of the apparatus by open-loop and/or closed-loop control. For example, the control unit may be set up to evaluate signals generated by the temperature sensor and to control the power source or voltage source by closed-loop control as a function of the temperature measured. For example, for this purpose, one or more electronic connections may be provided between the temperature sensor and the control unit. The control unit may comprise, for example, at least one data processing device, for example at least one computer or microcontroller. The data processing device may have one or more volatile and/or nonvolatile memory elements, in which case the data processing device may, for example, be programmed to actuate the temperature sensor. The control unit may also comprise at least one interface, for example an electronic interface and/or a human-machine interface, for example an input/output device such as a display and/or a keyboard. The control unit may be built, for example, in a centralized or else decentralized manner. Other configurations are also conceivable. The control unit may include at least one A/D converter. The apparatus may comprise an online temperature measurement. An "online temperature measurement" in the context of the present invention may be understood to mean a measurement of the temperature by the at least one temperature sensor which is made during the transport and/or the reaction of the feedstock in the reaction tube. For instance, closed-loop control of the temperature during operation is possible. In particular, a temperature measurement and closed-loop control can be effected over a length of the reactor.

The heating shell may be arranged such that the heating shell at least partly surrounds the reaction tube. "At least partly surround" may be considered to mean embodiments in which one element completely surrounds another, and embodiments in which the element surrounds only subregions of the other element. For example, this may include embodiments in which the heating shell completely surrounds the reaction tube, and embodiments in which only subregions of the reaction tube are surrounded by the heating shell. For example, the reaction tube may be arranged as an inner cylinder in the heating shell. For example, a multitude of reaction tubes may be arranged within the heating shell. For example, two or more heating shells may be arranged in the form of a ring around the reaction tubes. For example, the reaction tube may be spiral-shaped and the heating shell may be arranged around the reaction tube. There are also conceivable embodiments in which different or identical heating shells are arranged around different regions of a reaction tube or two or more reaction tubes, and individual heating of the regions of the reaction tube(s) can be enabled.

The heating shell may directly surround the reaction tube and be set up to release its heat generated by current to the reaction tube. The expression "directly surround", as used here, is a broad expression that should be attributed its usual and common meaning as understood by a person skilled in the art. This expression is not restricted to a specific or adapted meaning. This expression may, without restriction, relate in particular to an arrangement of the reaction tube and of the heating shell as adjacent tubes of the apparatus. In particular, there may be no further tube disposed between the reaction tube and the heating shell. The reaction tube may, for example, be an electrically nonconductive, especially nonmetallic, reaction tube. The reaction tube may be configured as a directly electrically heated reaction tube. The reaction tube and the heating shell may be configured as a monolithic tube, especially as a single electrically conductive tube, which is heated by Joule heat via the the passage of electrical current. The reaction tube and the heating shell may be made in one piece.

However, other arrangements of reaction tube and heating shell are also conceivable. For example, the heating shell can indirectly surround the reaction tube. The expression "indirectly surround", as used here, is a broad expression that should be attributed its usual and common meaning as understood by a person skilled in the art. This expression is not restricted to a specific or adapted meaning. This expression may, without restriction, relate in particular to an arrangement of the reaction tube and the heating shell in which at least one further element of the apparatus, especially a further tube, is disposed between the reaction tube and the heating shell. The reaction tube may, for example, be an electrically conductive, especially metallic, reaction tube. The apparatus may comprise at least one galvanic insulator, especially one that is thermally conductive. The galvanic insulator may be disposed between the reaction tube and the heating shell. The galvanic insulator may be set up to galvanically insulate the reaction tube from the heating shell and to transfer heat from the heating shell to the reaction tube. The expression "galvanic insulator", as used here, is a broad expression that should be attributed its usual and common meaning as understood by a person skilled in the art. This expression is not restricted to a specific or adapted meaning. This expression may, without restriction, refer in particular to a nonconductor or poor conductor. The galvanic insulator may have a specific electrical resistivity $\rho$ of $1 \times 10^5$ $\Omega m \leq \rho \leq 1 \times 10^{14}$ $\Omega m$. A coefficient of heat transfer may be high. The galvanic insulator may have a thermal conductivity A of 10 W/(mK)$\leq \lambda \leq$6000 W/(mK), preferably of 20 W/(mK)$\leq \lambda \leq$5000 W/(mK). The galvanic insulator may include at least one material selected from the group consisting of ceramic, glassy, glass fiber-reinforced, plastic-like or resin-like materials, for example ceramic, steatite, porcelain, glass, glass fiber-reinforced plastic, epoxy resin, thermoset, elastomers, and also sufficiently electrically insulating liquids, an insulating paint. The galvanic insulator may be configured as one or more of the following: a tube, a thin film, a covering, or a layer. The galvanic insulator may, for example, be a flexible galvanic insulator, for example a thin film. In this way, expansion in the event of temperature differences may be enabled. The galvanic insulator may be set up to transfer heat from the electrified heating shell to the reaction tube. At the same time, the galvanic insulator can galvanically insulate the reaction tube from the heating shell.

The apparatus has at least one energy recovery shell at least partly surrounding the reaction tube. "At least partly surround" may be considered to mean embodiments in which one element completely surrounds another element, and embodiments in which the element surrounds only subregions of the other element. For example, this may include embodiments in which the energy recovery shell completely surrounds the reaction tube, and embodiments in which only subregions of the reaction tube are surrounded by the energy recovery shell. The expression "energy recovery shell", as used here, is a broad expression that should be attributed its usual and common meaning as understood by a person skilled in the art. This expression is not restricted to a specific or adapted meaning. The expression may, without restriction, relate more particularly to a shell set up to at least partly recover the energy expended for the heating of the feedstock.

The energy recovery shell has at least one thermoelectric generator (TEG) set up to convert heat to electrical energy. The expression "convert", as used here, is a broad expression that should be attributed its usual and common meaning as understood by a person skilled in the art. This expression is not restricted to a specific or adapted meaning. The term may, without restriction, refer in particular to a thermoelectric energy conversion. The heat can be converted at least partly to energy. For example, the TEG may have an efficiency of 5-10%.

The expression "thermoelectric generator", also referred to as Seebeck generator, as used here, is a broad expression that should be attributed its usual and common meaning as understood by a person skilled in the art. This expression is not restricted to a specific or adapted meaning. This term may, without restriction, relate in particular to an apparatus set up to convert heat flows (temperature differences) to electrical energy via what is called the Seebeck effect. The energy recovery shell may be set up to convert heat that arises in an exothermic reaction, especially in a decoking operation, in the reaction tube to electrical energy. A chemical reaction can be considered to be exothermic when it releases more energy than it has initially been supplied with as activation energy. The exothermic reaction may proceed during a decoking and/or oxidation operation on the deposits in the reaction tube. For example, a temperature difference may arise in that there is a temperature of 1000° C. in the reaction tube, and a temperature of 20° C. at an outer shell of the apparatus, for example after a cooling operation.

The TEG may be configured, for example, as described in US 2014/0238459 A1, Mengjun Zhang et al., "Performance comparison of annular and flat-plate thermoelectric generators for cylindrical hot source", https://doi.org/10.1016/j.e-gyr.2021.01.008, 2352-4847/2021, published by Elsevier Ltd. Use of TEGs is known in other technical fields, for example for thermal power plants from KR 20190040433, for thermoelectric gas cookers for domestic use from CN106953548, for vehicle offgas systems from EP3151293, or for resistance heaters from JP2008032341 and JP2002171776.

The energy recovery shell may include at least one material having a thermoelectric figure of merit ZT of $\geq 0.5$, preferably $>0.8$, more preferably $\geq 1$. The thermoelectric figure of merit may be described as ZT=$(\alpha^2(T) \cdot \sigma(T) \cdot T)/\kappa(T)$, where $\alpha$ is the Seebeck coefficient, $\sigma$ the electrical conductivity, and $\kappa$ the specific thermal conductivity of the material. The energy recovery shell may comprise at least one material selected from the group consisting of: lead-tellurium (Pb—Te), at least one telluride, at least one silicone, at least one silicate, at least one silicide, at least one SiGe silicide, at least one polymer, at least one ceramic, at least one skutterudite, CoSb3 skutterudite, germanium, at least one semi-Heusler alloy, $Mg_2(Sn, Si)$, $Sr_{1-x}A_x Zn_{1-y}Ga_ySn_{1-z}X_z$ (A: Ca, Ba, La, Eu; X: Si, Sb), $Ca_{1-x}A_x Al_{2-y}TM_yS_2$ (A=Sr, Ba; TM=Mn, Zn). The TEG may have a thickness of 2 mm to 50 mm, preferably 2 mm to 30 mm, more preferably 5 mm to 30 mm.

The energy recovery shell may have a multitude of thermoelectric modules. The expression "module", as used here, is therefore likewise a broad expression that should be attributed its usual and common meaning as understood by a person skilled in the art. This expression is not restricted to a specific or adapted meaning. This expression may, without restriction, refer in particular to a multipart embodiment of the energy recovery shell.

The TEG may be of flat or annular configuration, as described, for example, in Mengjun Zhang et al., "Performance comparison of annular and flat-plate thermoelectric generators for cylindrical hot source", https://doi.org/10.1016/j.egyr.2021.01.008, 2352-4847/2021, published by Elsevier Ltd. The geometry and/or modularity of the TEG may be dependent on the geometry of the reaction tube and/or on an expected temperature difference.

The reaction tube and the energy recovery shell may be in a concentric arrangement. The reaction tube may be an inner tube and the energy recovery shell may be arranged further to the outside. For example, the energy recovery shell may be an outer shell of the apparatus. However, other designs are also conceivable. For example, the apparatus may additionally have an outer shell that at least partly surrounds all the tubes of the apparatus.

The apparatus may include at least one energy storage means for absorption of electrical energy from the energy recovery shell and/or at least one feed to a consumer to feed in electrical energy from the energy recovery shell. The consumption may be complete or at least partial. The consumption may include storing. The consumption may include a conversion of the electrical energy to another form of energy. The consumer may, for example, be one or more of a charging station, an illumination, another reactor or any other consumer. Examples are heat exchangers, heat transferers, energy storage means, batteries or accumulators. The heat absorbed may be used to heat the reaction tube from which the energy has been recovered or another reaction tube. Other uses of the energy recovered are also conceivable.

The TEG may be configured such that the electrical energy can be withdrawn directly. The apparatus may therefore be configured such that the temperature directly at the TEG is not too hot and at the same time not too cold. The TEG material used may be stable over a temperature range, especially at temperatures to which the feedstock is heated. Alternatively or additionally, the apparatus may have further elements for protection of the TEG, for example for cooling or precooling. The temperature may thus be adjusted depending on the materials of the TEGs.

The apparatus may have at least one cooling shell set up to at least partly surround the energy recovery shell. The cooling shell may be set up for cooling to room temperature or lower. The expression "cooling shell", as used here, is a broad expression that should be attributed its usual and common meaning as understood by a person skilled in the art. This expression is not restricted to a specific or adapted meaning. This expression may, without restriction, relate in particular to a shell set up to adjust a temperature difference relative to a temperature of the reaction tube, especially of a shell of the reaction tube, for example to a defined value. The cooling shell may have at least one cooling medium.

The expression "outer shell", as used here, is a broad expression that should be attributed its usual and common meaning as understood by a person skilled in the art. This expression is not restricted to a specific or adapted meaning. This expression may, without restriction, refer in particular to an outermost shell of the apparatus, especially in a concentric arrangement. The outer shell may accommodate all elements of the apparatus, especially all tubes. The outer shell may be set up as a housing. The outer shell may be set up to also galvanically insulate the apparatus. The outer shell may be thermally insulating and to at least partly reduce a loss of heat to the outside. "To at least partly reduce a loss of heat to the outside" in the context of the present invention may be considered to mean embodiments with complete thermal insulation, and also embodiments in which there is incomplete heat reduction, for example down to a predetermined temperature. For example, the outer shell may surround at least a subregion along the heating shell, for example in at least a particularly heat-sensitive outer region of the environment. The outer shell, with regard to the materials used, may be set up with a specific electrical resistivity and thermal conductivity like the galvanic insulator described above between the reaction tube and the heating shell.

In a further aspect, in the context of the present invention, a plant comprising an apparatus of the invention is proposed. With regard to the configuration and definitions of the plant, reference may be made to the description of the apparatus further up or down.

The plant is selected from the group consisting of: a plant for performance of at least one endothermic reaction, a plant for heating, a plant for preheating, a steamcracker, a steam reformer, an apparatus for alkane dehydrogenation, a reformer, an apparatus for dry reforming, an apparatus for styrene production, an apparatus for ethylbenzene dehydrogenation, production of acetylene, a cracker, a catalytic cracker, an apparatus for dehydrogenation.

In a further aspect, in the context of the present invention, a method of recovering electrical energy using an apparatus of the invention is proposed. The method comprises the following steps:

passing the feedstock through the reaction tube;
converting heat evolved in the reaction tube in a chemical reaction to electrical energy with the thermoelectric generator in the energy recovery shell.

The method may further include a storage step in which the electrical energy is stored in at least one energy storage means and/or fed to a consumer.

With regard to embodiments and definitions, reference can be made to the above description of the apparatus. The method steps may be carried out in the sequence specified, although it is also possible for one or more of the steps to be conducted simultaneously at least in part, and it is also possible for one or more of the steps to be repeated more than once. In addition, further steps may be additionally performed, irrespective of whether or not they have been mentioned in the present description.

In summary, in the context of the present invention, particular preference is given to the following embodiments:

Embodiment 1 An apparatus comprising a multitude of tubes, where at least one of the tubes is set up as a reaction tube for at least one feedstock to flow through, where the apparatus has at least one energy recovery shell that at least partly surrounds the reaction tube, where the energy recovery shell has at least one thermoelectric generator set up to convert heat to electrical energy.

Embodiment 2 The apparatus according to the preceding embodiment, wherein the energy recovery shell is set up to convert heat evolved in an exothermic reaction in the reaction tube to electrical energy.

Embodiment 3 The apparatus according to the preceding embodiment, wherein the exothermic reaction proceeds during decoking and/or oxidation of deposits in the reaction tube.

Embodiment 4 The apparatus according to any of the preceding embodiments, wherein the energy recovery shell includes at least one material having a thermoelectric figure of merit ZT of $\geq 0.5$, preferably $\geq 0.8$, more preferably $\geq 1$.

Embodiment 5 The apparatus according to any of the preceding embodiments, wherein the energy recovery shell includes at least one material selected from the group consisting of: lead-tellurium (Pb—Te), at least one telluride, at least one silicone, at least one silicate, at least one silicide, at least one Si—Ge silicide, at least one polymer, at least one ceramic, at least one skutterudite, CoSb3 skutterudite, germanium, at least one semi-Heusler alloy, $Mg_2(Sn, Si)$, $Sr_{1-x}A_xZn_{1-y}Ga_y$ $Sn_{1-z}X_z$ (A: Ca, Ba, La, Eu; X: Si, Sb), $Ca_{1-x}A_x$ $Al_{2-y}TM_ySi_2$ (A=Sr, Ba; TM=Mn, Zn).

Embodiment 6 The apparatus according to any of the preceding embodiments, wherein the energy recovery shell has a multitude of thermoelectric modules.

Embodiment 7 The apparatus according to any of the preceding embodiments, wherein the reaction tube and the energy recovery shell are in a concentric arrangement, where the reaction tube is an inner tube and the energy recovery shell is arranged further to the outside.

Embodiment 8 The apparatus according to any of the preceding embodiments, wherein the energy recovery shell is an outer shell of the apparatus.

Embodiment 9 The apparatus according to the preceding embodiment, wherein the apparatus additionally has an outer shell that at least partly surrounds all the tubes of the apparatus.

Embodiment 10 The apparatus according to any of the preceding embodiments, wherein the reaction tube includes at least one material selected from the group consisting of: at least one ferritic material, at least one austenitic material, at least one metal, at least one metallic alloy, copper, aluminum, iron, steel alloy, Cr alloy and/or Ni alloy, graphite, carbon, carbide, silicide.

Embodiment 11 The apparatus according to any of the preceding embodiments, wherein the reaction tube is an electrically conductive tube.

Embodiment 12 The apparatus according to any of embodiments 1 to 9, wherein the reaction tube is configured as a ceramic tube.

Embodiment 13 The apparatus according to any of the preceding embodiments, wherein the apparatus has at least one current-conducting heating shell, where the apparatus has at least one current or voltage source set up to generate an electrical current in the heating shell, which heats the reaction tube by Joule heat evolved on passage of the electrical current through the heating shell.

Embodiment 14 The apparatus according to the preceding embodiment, wherein the heating shell at least partly surrounds the reaction tube.

Embodiment 15 The apparatus according to the preceding embodiment, wherein the heating shell directly surrounds the reaction tube and is set up to release its heat generated by current to the reaction tube.

Embodiment 16 The apparatus according to embodiment 13, wherein the apparatus has at least one galvanic insulator, where the galvanic insulator is disposed between the reaction tube and the heating shell, where the galvanic insulator is set up to galvanically insulate the reaction tube from the heating shell and to transfer heat from the heating shell to the reaction tube.

Embodiment 17 The apparatus according to the preceding embodiment, wherein the galvanic insulator includes at least one material selected from the group consisting of ceramic, glassy, glass fiber-reinforced, plastic-like or resin-like materials, an insulating paint, where the galvanic insulator is configured as one or more of a tube, a thin foil, a covering, or a layer.

Embodiment 18 The apparatus according to any of the five preceding embodiments, wherein the apparatus has at least one temperature sensor set up to determine a temperature of the reaction tube, where the apparatus has at least one control unit set up to control the power source or voltage source by closed-loop control as a function of a temperature measured by the temperature sensor.

Embodiment 19 The apparatus according to any of the six preceding embodiments, wherein the power source and/or voltage source comprises a single-phase or multiphase AC power source and/or a single-phase or multiphase AC voltage source, or a DC power source and/or DC voltage source.

Embodiment 20 The apparatus according to any of the preceding embodiments, wherein the apparatus has at least one cooling shell set up to at least partly surround the energy recovery shell, where the cooling shell is set up for cooling to room temperature or lower.

Embodiment 21 The apparatus according to any of the preceding embodiments, wherein the apparatus includes at least one energy storage means for absorption of electrical energy from the energy recovery shell and/or at least one feed to a consumer to feed in electrical energy from the energy recovery shell.

Embodiment 22 The apparatus according to any of the preceding embodiments, wherein the apparatus is set up to heat the feedstock to a temperature in the range from 200° C. to 1700° C., preferably 300° C. to 1400° C., more preferably 400° C. to 875° C.

Embodiment 23 The apparatus according to any of the preceding embodiments, wherein the apparatus has a multitude of reaction tubes, where said apparatus has I reaction tubes where I is a natural number not less than two, where said reaction tubes have symmetric or asymmetric pipes and/or a combination thereof.

Embodiment 24 The apparatus according to any of the preceding embodiments, wherein the feedstock includes at least one medium selected from the group consisting of: air, at least one oxygen-containing medium, water, water vapor, and at least one oxidizing medium.

Embodiment 25 The apparatus according to any of the preceding embodiments, wherein the reaction tube is set up for at least one feedstock to flow through in order to conduct at least one endothermic reaction.

Embodiment 26 A plant comprising at least one apparatus according to any of the preceding embodiments, wherein the plant is selected from the group consisting of: a plant for performance of at least one endothermic reaction, a plant for heating, a plant for preheating, a steamcracker, a steam reformer, an apparatus for alkane dehydrogenation, a reformer, an apparatus for dry reforming, an apparatus for styrene production, an apparatus for ethylbenzene dehydrogenation, production of acetylene, a cracker, a catalytic cracker, an apparatus for dehydrogenation.

Embodiment 27 A method of recovering electrical energy using an apparatus according to any of the preceding embodiments relating to an apparatus, said method comprising the following steps:

passing the feedstock through the reaction tube;

converting heat evolved in the reaction tube in a chemical reaction to electrical energy with the thermoelectric generator in the energy recovery shell.

BRIEF DESCRIPTION OF THE FIGURES

Further details and features of the invention will be apparent from the description of preferred working examples that follows, in particular in conjunction with the subsidiary claims. The respective features may in this case be implemented on their own, or two or more may be implemented in combination with one another. The invention is not restricted to the working examples. The working examples are illustrated diagrammatically in the figures. Identical reference numerals in the individual figures relate to elements that are the same or have the same function, or correspond to one another in expressions of their functions.

BRIEF DESCRIPTION OF THE DRAWINGS

Figure 1A:
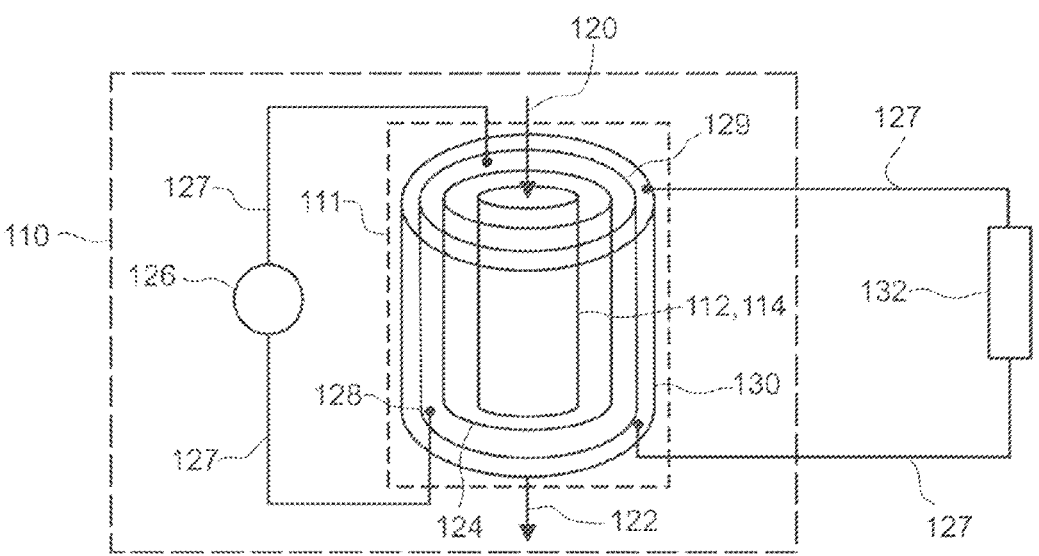
Figure 1B:
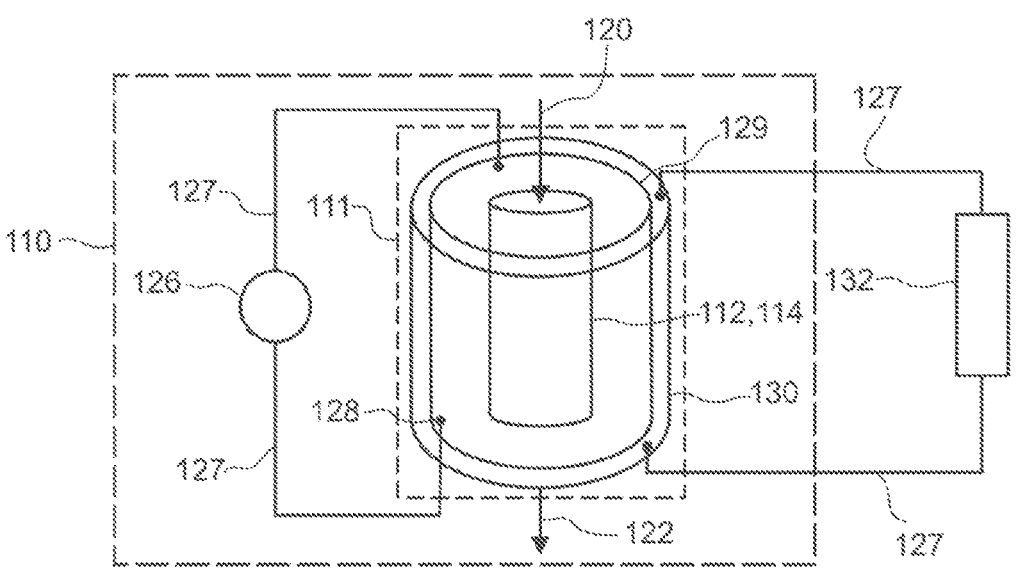
Figure 2A:
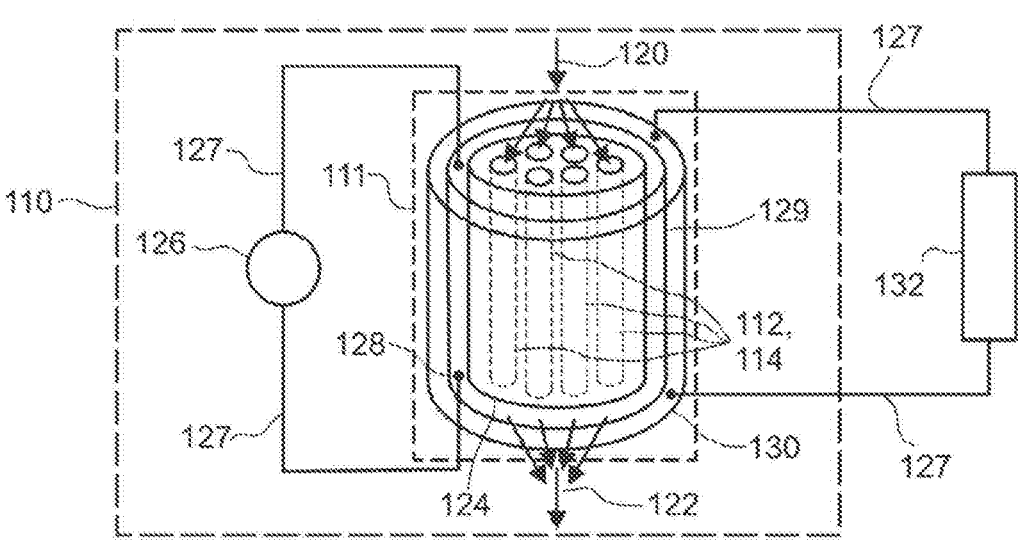
Figure 2B:
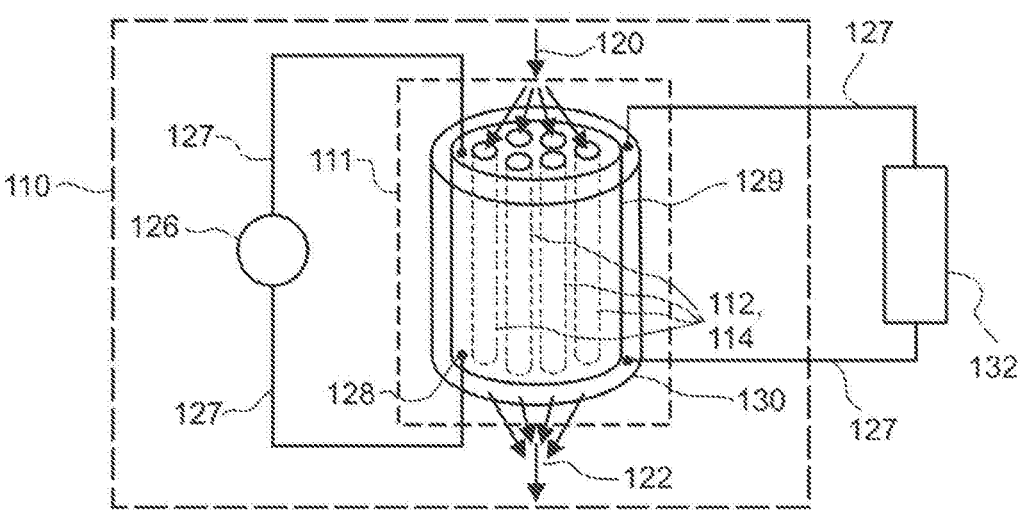
Figure 3A:
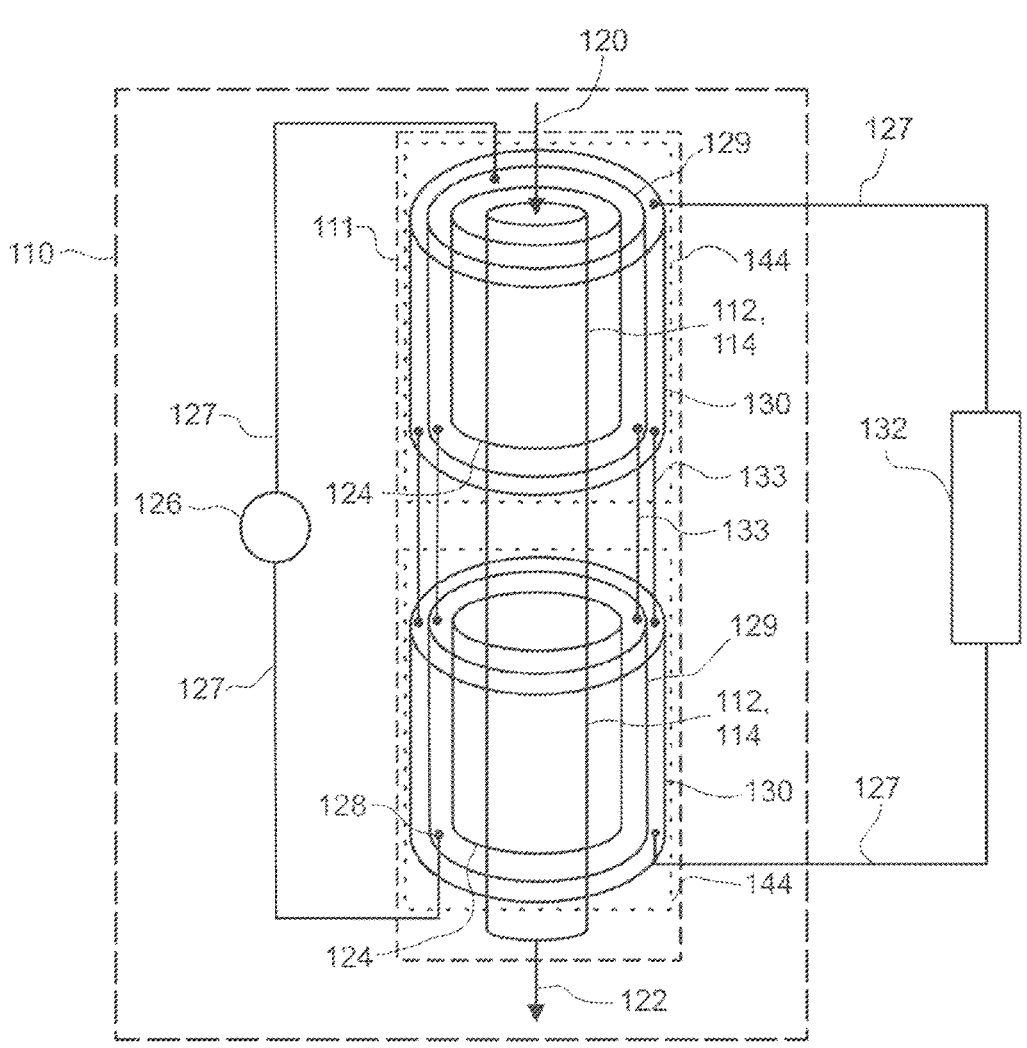
Figure 3B:
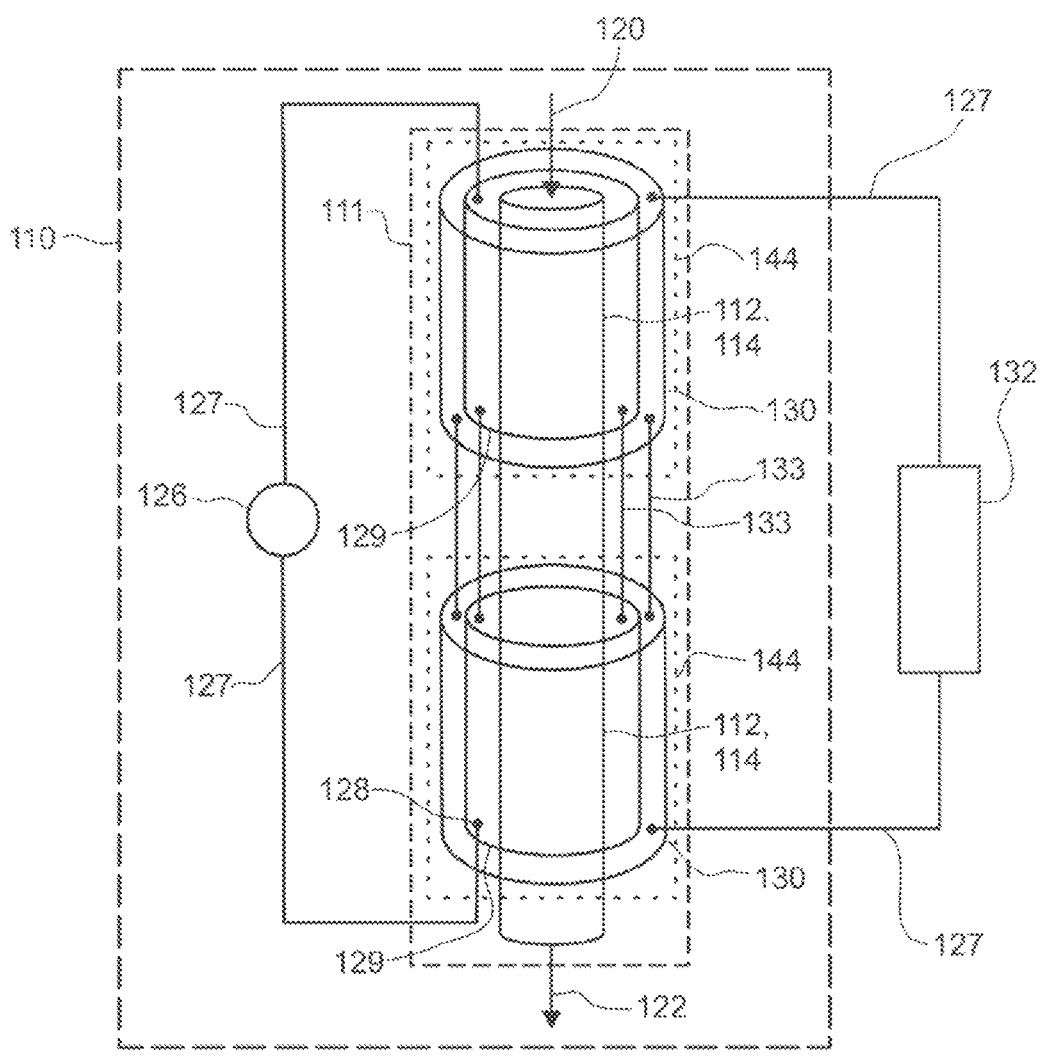
Figure 4A:
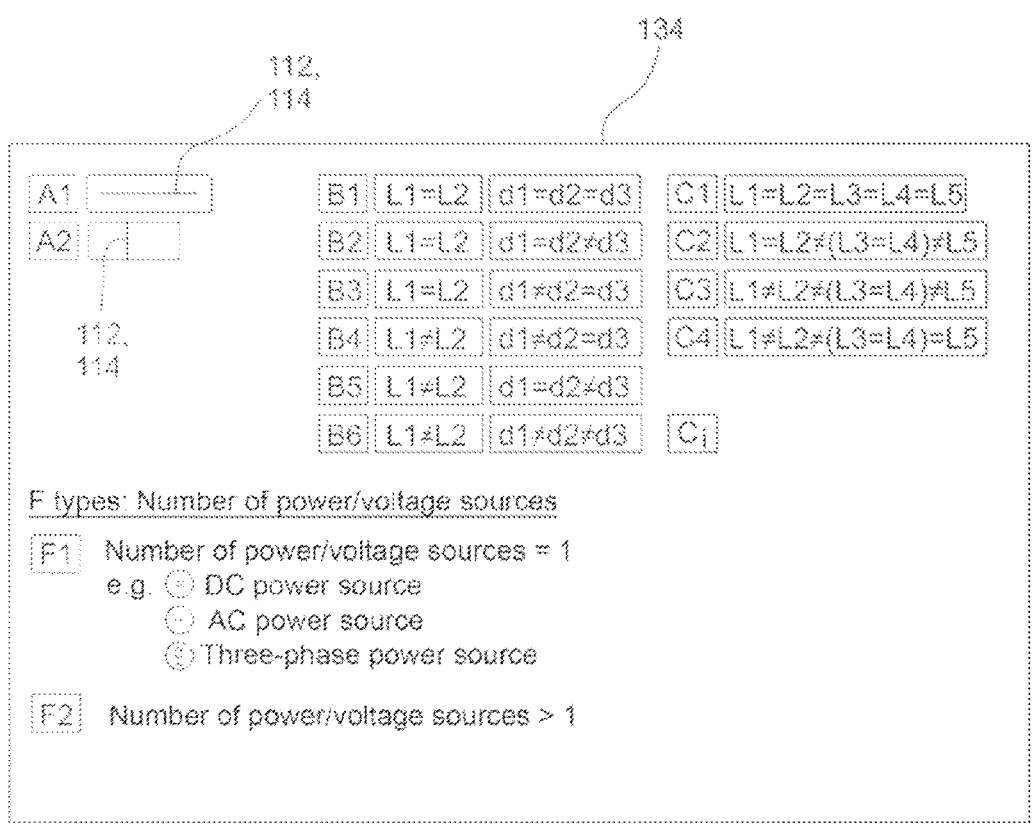
Figure 4B:
Figure 4C:
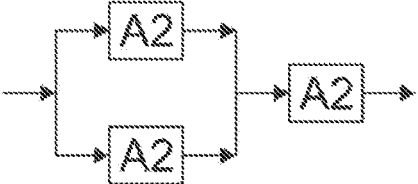
Figure 4D:
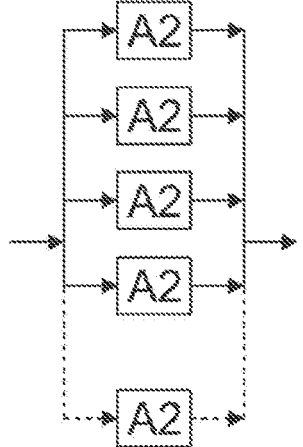
Figure 4E:
Figure 4F:
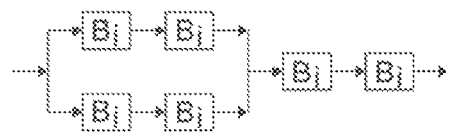
Figure 4G:
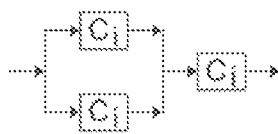
Figure 4H:
Figure 4I:
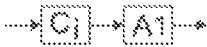
Figure 4J:
Figure 4K:
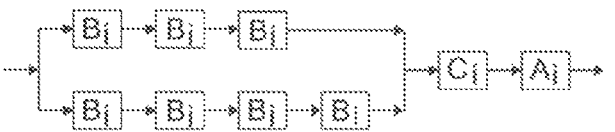
Figure 4L:
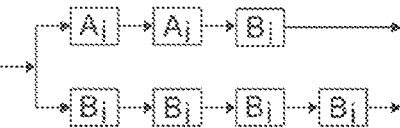
Figure 4M:
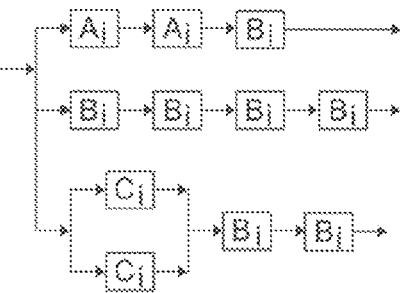
Figure 4N:
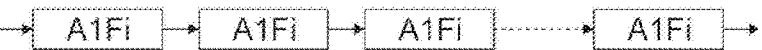
Figure 4O:
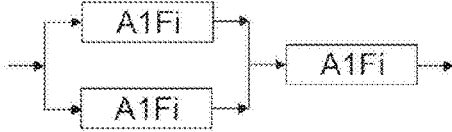
Figure 4P:
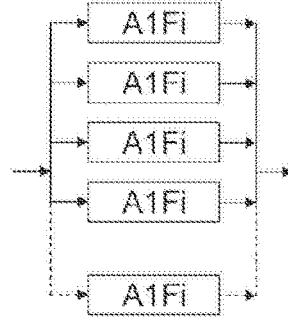
Figure 4Q:
Figure 4R:
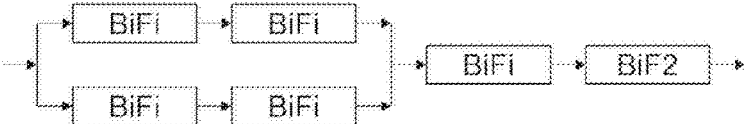
Figure 4S:
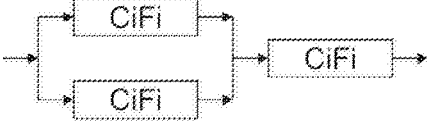
Figure 4T:
Figure 4U:
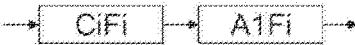
Figure 4V:
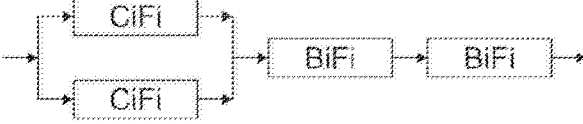
Figure 4W:
Figure 4X:
Figure 4Y:
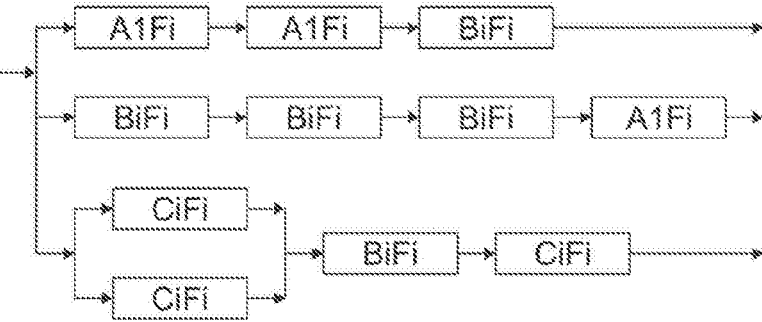
Figure 5A:
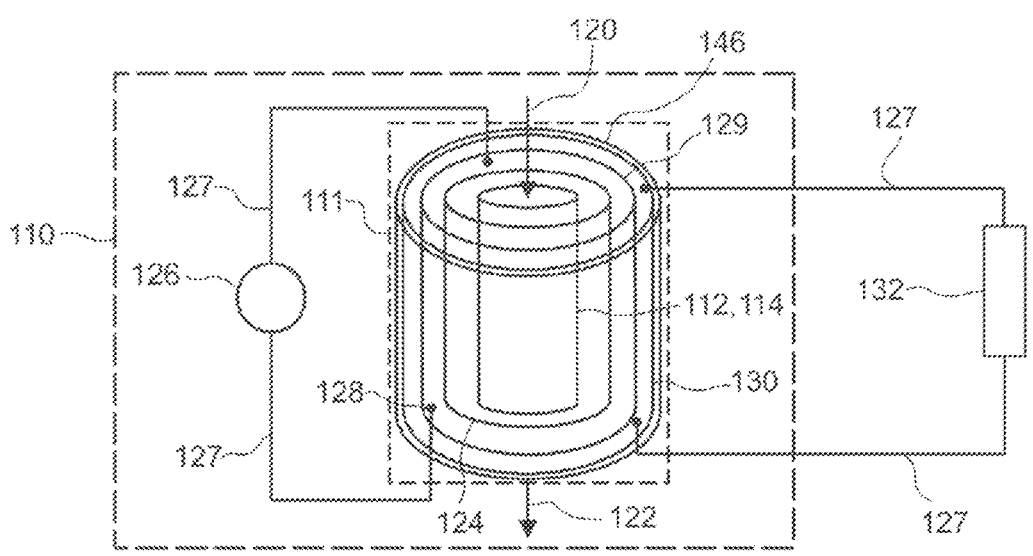
Figure 5B:
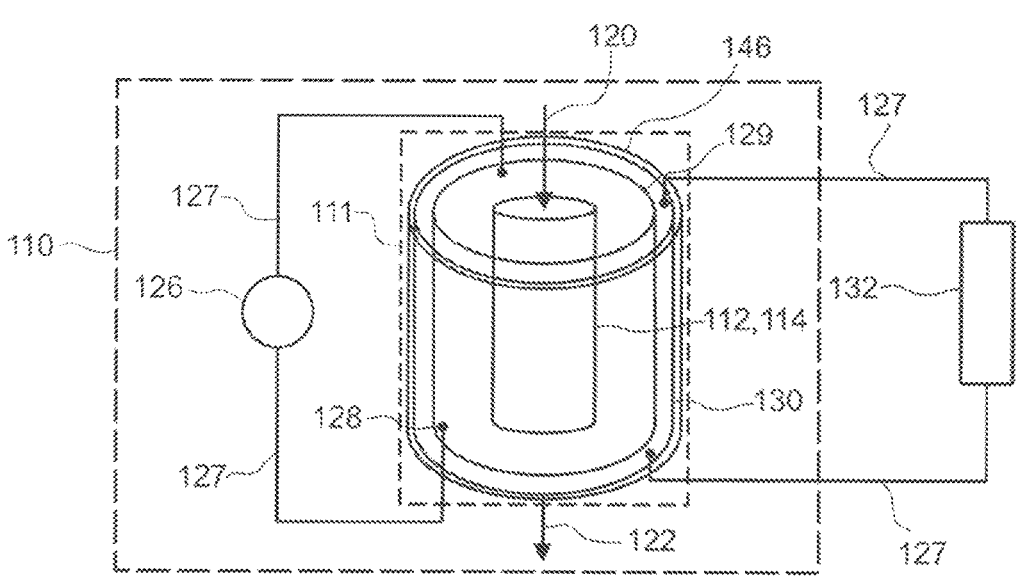
Figure 6A:
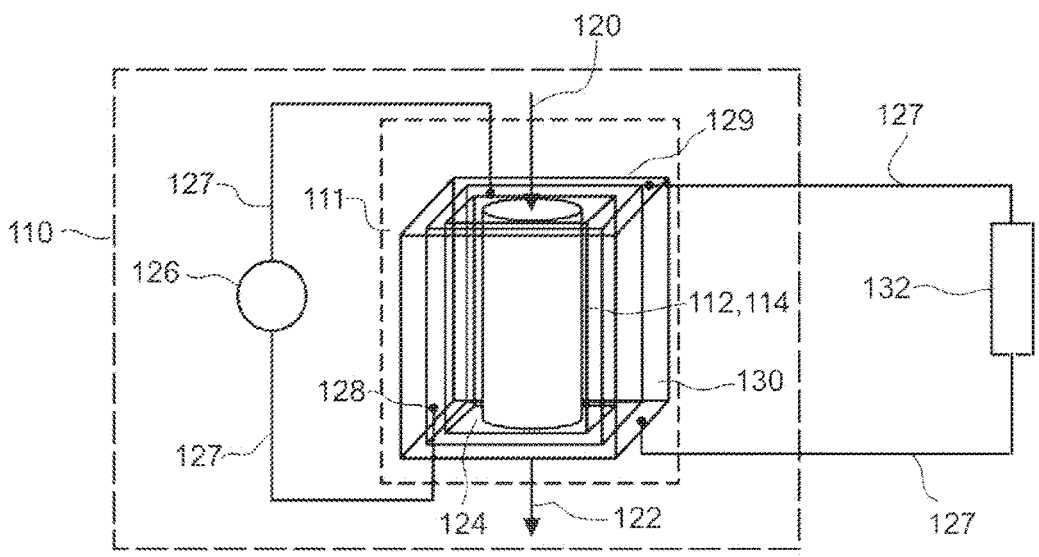
Figure 6B:
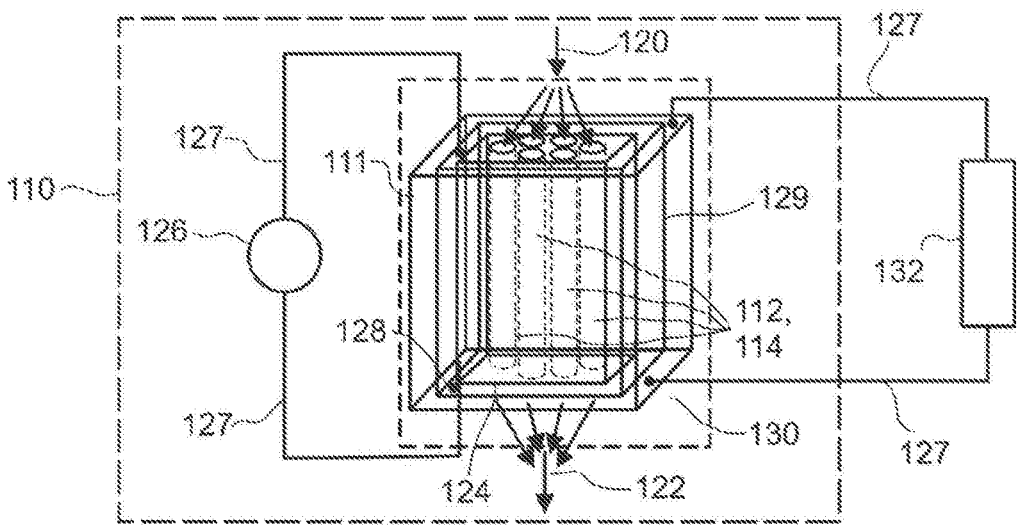
Figure 7A:
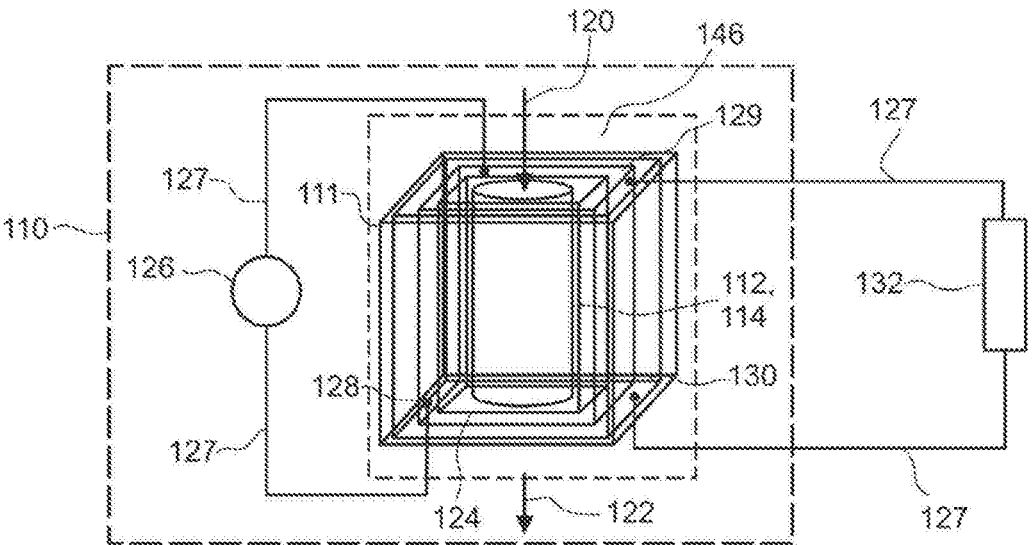
Figure 7B:
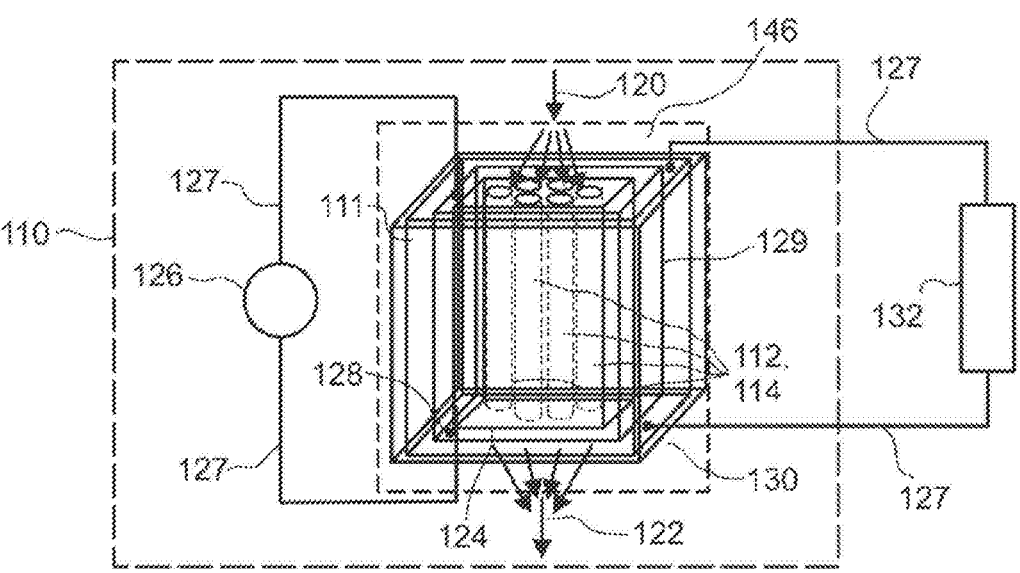

FIGS. 1a and 1b embodiments of an apparatus of the invention with a reaction tube;

FIGS. 2a and 2b embodiments of the apparatus of the invention having a multitude of reaction tubes;

FIGS. 3a and 3b embodiments of the apparatus of the invention comprising two heating zones;

FIGS. 4a to 4y embodiments of the apparatus of the invention with a construction kit with tube types for possible reaction tubes and examples of variations;

FIGS. 5a and 5b embodiments of the apparatus of the invention with cooling circuit;

FIGS. 6a and 6b embodiments of the apparatus of the invention analogous to FIGS. 1a and 2a with a rectangular pipe design;

FIGS. 7a and 7b embodiments of the apparatus of the invention with a rectangular pipe design with cooling circuit; and FIGS. 8a to 8d embodiments of the apparatus of the invention with energy storage units and use examples.

WORKING EXAMPLES

FIGS. 1a and 1b show a schematic diagram of two embodiments of an inventive apparatus 110 each with one reaction tube 112. The apparatus 110 comprises a multitude of tubes. The apparatus 110 comprises, for example, in the in FIGS. 1a and 1b embodiments, three hollow cylindrical tubes in a concentric arrangement. At least one of the tubes is set up as a reaction tube 112 for at least one feedstock to flow through. The apparatus 110 may have at least one reactive space 111. The apparatus 110 may be usable in a plant selected from the group consisting of: a plant for performance of at least one endothermic reaction, a plant for heating, a plant for preheating, a steamcracker, a steam reformer, an apparatus for alkane dehydrogenation, a reformer, an apparatus for dry reforming, an apparatus for styrene production, an apparatus for ethylbenzene dehydrogenation, production of acetylene, a cracker, a catalytic cracker, an apparatus for dehydrogenation.

The reaction tube 112 may be configured as a tube through which material can flow. The reaction tube 112 may be set up for the feedstock to flow through it. The reaction tube 112 may be set up to allow at least one chemical reaction, and/or a subreaction, to proceed in the reaction tube. The reaction tube 112 may comprise at least one pipeline and/or at least one pipeline segment 114 and/or at least one pipeline coil. A pipeline segment 114 may be a subregion of a pipeline.

The reaction tube may be set up, for example, to heat the feedstock. The reaction tube 112 may be a reactor and/or a furnace or a portion thereof. For example, the reaction tube 112 may be configured as a reactor of a combustion furnace and/or of an electrically heatable reactor. For example, the reaction tube 112 may be configured as a reactor of a combustion furnace, as described, for example, in H. Zimmermann and R. Walzl, "Ethylene", Ullmann's Encyclopedia of Industrial Chemistry, 2012 Wiley-VCH Verlag Gmbh & Co. KGaA, Weinheim, DOI: 10.1002/14356007.a10_045.pub3, EP 2 653 524 A1, U.S. Pat. No. 4,361,478 A, EP 0 245 839 A1 or EP3415587A1. For example, the reaction tube 112 may be configured as an electrically heatable reactor, as described, for example, in WO 2015/197181 A1, WO 2020/035575 A1, and WO 2020/035574 A1.

The geometry and/or surfaces and/or material of the reaction tube 112 may be dependent on the feedstock. Alternatively or additionally, geometry and/or surfaces and/or material of the reaction tube 112 may be dependent on a desired reaction and/or avoidance of a particular reaction and/or optimization of the reaction and/or other factors. For example, the reaction tube 112 may be configured as a hollow cylinder. For example, as shown in FIGS. 1a to 3b, all tubes of the apparatus 110 may be configured as a hollow cylinder. The tubes may be of fully cylindrical configuration or else have noncylindrical sections. The hollow cylinder may, for example, be a circular cylinder with radius r and a length h, also referred to as height. The circular cylinder may have a bore along an axis. Variances from a circular cylinder geometry are also conceivable. For example, the tube may have an elliptical cross-sectional area. Other geometries are also conceivable.

The feedstock may be basically any free-flowing medium. The feedstock may be liquid or gaseous. The feedstock may include at least one medium selected from the group consisting of: air, at least one oxygen-containing medium, water, water vapor, and at least one oxidizing medium.

Other feedstocks are also conceivable. A number of side reactions occur in the above-listed plants for performance of at least one endothermic reaction, and these can lead, for example, to coking of plant components, especially the reaction tubes 112. It is therefore customary, for example at fixed or regular intervals, to conduct exothermic reactions to burn off the coking, especially what is called decoking of the plant. In the case of decoking, the feedstock, also referred to as decoking gas, can be fed into the reaction tube 112 and the coking can be burnt off at least one exothermic reaction.

The reaction tube 112 may be an electrically conductive, especially metallic, reaction tube 112 or an electrically nonconductive reaction tube 112. In the working example of FIG. 1a, the reaction tube may be an electrically conductive metallic reaction tube. The reaction tube 112 may have a specific electrical resistivity of less than $10^{-1}$ $\Omega$m. The reaction tube 112 may have a specific electrical resistivity $\rho$ of $1 \cdot 10^{-8}$ $\Omega$m$\leq\rho\leq10^{-1}$ $\Omega$m. For example, the reaction tube 112 may include at least one material selected from the group consisting of: at least one ferritic material, at least one austenitic material, at least one metal, at least one metallic alloy, copper, aluminum, iron, steel alloy, Cr alloy and/or Ni alloy, graphite, carbon, carbide, silicide.

However, configurations of the reaction tube 112 as electrically nonconductive tubes or poorly conducting tubes are also conceivable, as shown in FIG. 1b. For example, the reaction tube 112 may be manufactured from a ceramic or materials having similar specific resistivity. The reaction tube 112 may be configured as a galvanic insulator. The reaction tube 112 may have a specific electrical resistivity of more than $10^5$ $\Omega$m. The reaction tube 112 may have a specific electrical resistivity $\rho$ of $1\times10^5$ $\Omega$m$\leq\rho\leq1\times10^{20}$ $\Omega$m, preferably of $1\times10^5$ $\Omega$m$\leq\rho\leq1\times10^{14}$ $\Omega$m. For example, the reaction tube 112 may be configured as a ceramic tube. For example, the reaction tube 112 may include at least one material selected from the group consisting of: MgO, $Al_2O_3$, boron nitride, aluminum nitride, aluminum silicate (mullite), $ZrO_2$, magnesium aluminum silicate (cordierite), magnesium silicate (steatite), silicon nitride.

The apparatus 110 may have at least one heating shell 129, as shown in FIGS. 1a and 1b. The apparatus 110 may have at least one power source or voltage source 126 set up to generate an electrical current in the heating shell 129 that heats the reaction tube 112 by means of Joule heat that arises on passage of the electrical current through the heating shell 129. The heating shell 129 may be any shell set up to transfer energy supplied thereto in the form of heat to the reaction tube 112. The heating shell 129 may at least partly surround the reaction tube 112. The geometry and/or material of the heating shell 129 may be matched to the reaction tube 112 to be heated. For instance, energy-efficient heating of the reaction tube 112 may be possible.

The heating shell 129 may include at least one material selected from the group consisting of ferritic and austenitic materials, for example CrNi alloy, CrMo or ceramic. For example, the heating shell may have been produced from at least one metal and/or at least one alloy, such as copper, aluminum, iron, steel or Cr or Ni alloys, graphite, carbon, carbides, silicides.

Semiconductors are also conceivable as material for the heating shell, for example Ge, Si, selenides, tellurides, arsenides, antimonide.

The heating shell 129 may be a current-conducting heating shell. The heating shell 129, especially with a connected power source or voltage source 126, may have a specific electrical resistivity $\rho$ of $1\times10^{-8}$ $\Omega m \leq \rho \leq 10^{5}$ $\Omega m$. The heating shell 129 may have a thermal conductivity $\lambda$ of 10 W/(mK)$\leq\lambda\leq$6000 W/(mK), preferably of 20 W/(mK)$\leq\lambda\leq$5000 W/(mK). The heating shell 129 may be thermally stable within a range of up to 2000° C., preferably up to 1300° C., more preferably up to 1000° C.

As set out above, the apparatus 110 may have at least one power source or at least one voltage source 126 set up to generate an electrical current in the heating shell 129 that heats the reaction tube 112 by means of Joule heat that arises on passage of the electrical current through the heating shell. The power source and/or the voltage source 126 may comprise a single-phase or multiphase AC power source and/or single-phase or multiphase AC voltage source, or a DC power source and/or DC voltage source. The apparatus 110 may have at least one input and output 127 that electrically connects the power source and/or voltage source 126 to the heating shell 129, especially via electrical terminals 128.

The current generated in the heating shell 129 can heat the reaction tube 112 by Joule heat that arises on passage of the electrical current through the heating shell 129, in order to heat the feedstock. The heating of the reaction tube 112 may comprise at least one operation that leads to a change in a temperature of the reaction tube 112, especially a rise in the temperature of the reaction tube 112, and/or has the effect that the temperature of the reaction tube 112 remains essentially constant, for example when the reaction that takes place in the reaction tube 112 consumes as much heat as it receives. The feedstock may, for example, be heated to a defined or predetermined temperature value. The apparatus 110 may be set up to heat the feedstock to a temperature in the range from 200° C. to 1700° C., preferably 300° C. to 1400° C., more preferably 400° C. to 875° C. However, other temperatures and temperature ranges are also conceivable.

The reaction tube 112 may be set up to at least partly absorb the Joule heat generated by the heating shell 129 and to at least partly release it to the feedstock. For example, at least one endothermic reaction can be effected in the reaction tube 112. The endothermic reaction may comprise heating and/or preheating of the feedstock. In particular, the feedstock may be heated in the reaction tube 112.

The heating shell 129 may be arranged such that the heating shell 129 at least partly surrounds the reaction tube 112. For example, the heating shell 129 may surround the reaction tube 112 completely, or else only subregions of the reaction tube 112. For example, the reaction tube 112 may be arranged as an inner cylinder in the heating shell 129. For example, two or more heating shells 129 may be arranged in the form of a ring around the reaction tubes 112. For example, the reaction tube 112 may be spiral-shaped and the heating shell 129 may be arranged around the reaction tube 112. There are also conceivable embodiments in which different or identical heating shells 129 are arranged around different regions of a reaction tube 112 or two or more reaction tubes 112, and individual heating of the regions of the reaction tube(s) 112 can be enabled.

As shown in FIG. 1*b*, the heating shell 129 may directly surround the reaction tube 112 and be set up to release its heat generated by current to the reaction tube 112. The reaction tube 112 and the heating shell 129 may be arranged as adjacent tubes of the apparatus 110. In particular, there may be no further tube disposed between the reaction tube 112 and the heating shell 129.

FIG. 1*a* shows a different arrangement of reaction tube 112 and heating shell 129. In this arrangement, the heating shell 129 indirectly surrounds the reaction tube 112. As set out above, the reaction tube 112 shown in FIG. 1*a* may be an electrically conductive, especially metallic, reaction tube 112. The apparatus 110 may comprise at least one galvanic insulator 124, especially one that is thermally conductive. The galvanic insulator 124 may be disposed between the reaction tube 112 and the heating shell 129. The galvanic insulator 124 may be set up to galvanically insulate the reaction tube 112 from the heating shell 129 and to transfer heat from the heating shell 129 to the reaction tube 112. The galvanic insulator 124 may have a specific electrical resistivity $\rho$ of $1\times10^{5}$ $\Omega m \leq \rho \leq 1\times10^{14}$ $\Omega m$. A coefficient of heat transfer may be high. The galvanic insulator 124 may have a thermal conductivity $\lambda$ of 10 W/(mK)$\leq\lambda\leq$6000 W/(mK), preferably of 20 W/(mK)$\leq\lambda\leq$5000 W/(mK). The galvanic insulator 124 may include at least one material selected from the group consisting of ceramic, glassy, glass fiber-reinforced, plastic-like or resin-like materials, for example ceramic, steatite, porcelain, glass, glass fiber-reinforced plastic, epoxy resin, thermoset, elastomers, and also sufficiently electrically insulating liquids, an insulating paint. The galvanic insulator 124 may be configured as one or more of the following: a tube, a thin film, a covering, or a layer. The galvanic insulator may, for example, be a flexible galvanic insulator, for example a thin film. In this way, expansion in the event of temperature differences may be enabled. The galvanic insulator 124 may be set up to transfer heat from the electrified heating shell 129 to the reaction tube 112. At the same time, the galvanic insulator 124 can galvanically insulate the reaction tube 112 from the heating shell 129.

FIGS. 2*a* and 2*b* show embodiments with a multitude of reaction tubes 112. With regard to the configuration of the further elements of the apparatus 110 of FIG. 2*a*, reference may be made to the description of FIG. 1*a*, and, with regard to the configuration of the further elements of the apparatus 110 of FIG. 2*b*, reference may be made to the description of FIG. 1*b*. The apparatus 110 may have I reaction tubes 112 where I is a natural number not less than two. For example, the apparatus 110 may comprise at least two, three, four, five or more reaction tubes 112. The apparatus 110 may for example comprise up to one hundred reaction tubes 112. For example, the reaction tubes 112 may be arranged within the heating shell 129. For example, the reaction tube 112 may be spiral-shaped and the heating shell may be arranged around the reaction tube. There are also conceivable embodiments in which different or identical heating shells are arranged around different regions of a reaction tube or two or more reaction tubes, and individual heating of the regions of the reaction tube(s) can be enabled.

The reaction tubes 112 may be through-connected and hence form a tube system 118. The tube system 118 may comprise incoming and outgoing tubes. The tube system 118 may comprise at least one inlet 120 for receiving the feedstock. The tube system 118 may comprise at least one outlet 122 for discharging the feedstock. The reaction tubes 112 may be fluidically connected to one another. Thus, the reaction tubes 112 may be arranged and connected in such a way that the feedstock flows through the reaction tubes 112 one after another. Two or more or all of the reaction tubes 112 may be configured in series and/or in parallel. The reaction tubes 112 may be interconnected parallel to one another in such a way that the feedstock can flow through at least two reaction tubes 112 in parallel. The reaction tubes 112, in particular the tubes connected in parallel, may be designed in such a way as to transport different feedstocks in parallel. In particular, the tubes connected in parallel may have mutually different geometries and/or surfaces and/or materials for transport of different feedstocks. For the transport of one feedstock in particular, a number or all of the reaction tubes 112 may be in parallel configuration, such that the feedstock can be divided among those tubes in parallel configuration. There are also conceivable combinations of a series connection and a parallel connection. In the case of use of electrically conductive tubes as reaction tube 112, the incoming and outgoing pipelines may be galvanically isolated from one another. For this purpose, the apparatus 110 may comprise at least one insulator, in particular a multitude of insulators. Galvanic isolation between the respective pipelines and the incoming and outgoing pipelines can be ensured by the insulators. The insulators can ensure free flow of the feedstock.

As shown schematically in FIGS. 1a and 1b, the apparatus 110 has at least one energy recovery shell 130 that at least partly surrounds the reaction tube 112. The energy recovery shell 130 may, for example, completely surround the reaction tube 112. The energy recovery shell 130 may be a shell set up to at least partly recover the energy expended for the heating of the feedstock. The energy recovery shell 130 has at least one thermoelectric generator (TEG) set up to convert heat to electrical energy. The conversion may be a thermoelectric energy conversion. The heat can be converted at least partly to energy. For example, the TEG may have an efficiency of 5-10%.

The TEG may be an apparatus set up to convert heat flows (temperature differences) to electrical energy via what is called the Seebeck effect. The energy recovery shell 130 may be set up to convert heat that arises in an exothermic reaction, especially in a decoking operation, in the reaction tube to electrical energy. A chemical reaction can be considered to be exothermic when it releases more energy than it has initially been supplied with as activation energy. The exothermic reaction may proceed during a decoking and/or oxidation operation on the deposits in the reaction tube. For example, a temperature difference may arise in that there is a temperature of 1000° C. in the reaction tube 112, and a temperature of 20° C. at an outer shell of the apparatus 110, for example after a cooling operation.

The TEG may be configured, for example, as described in US 2014/0238459 A1, Mengjun Zhang et al., "Performance comparison of annular and flat-plate thermoelectric generators for cylindrical hot source", https://doi.org/10.1016/j.egyr.2021.01.008, 2352-4847/2021, published by Elsevier Ltd.

The energy recovery shell 130 may include at least one material having a thermoelectric figure of merit ZT of ≥0.5, preferably ≥0.8, more preferably ≥1. The thermoelectric figure of merit may be described as $ZT=(\alpha^2(T)\cdot\sigma(T)\cdot T)/\kappa(T)$, where $\alpha$ is the Seebeck coefficient, $\sigma$ the electrical conductivity, and $\kappa$ the specific thermal conductivity of the material. The energy recovery shell 130 may comprise at least one material selected from the group consisting of: lead-tellurium (Pb—Te), at least one telluride, at least one silicone, at least one silicate, at least one silicide, at least one Si—Ge silicide, at least one polymer, at least one ceramic, at least one skutterudite, CoSb3 skutterudite, germanium, at least one semi-Heusler alloy, $Mg_2(Sn, Si)$, $Sr_{1-x}A_x$ $Zn_{1-y}Ga_ySn_{1-z}X_z$ (A: Ca, Ba, La, Eu; X: Si, Sb), $Ca_{1-x}A_x$ $Al_{2-y}TM_ySi_2$ (A=Sr, Ba; TM=Mn, Zn). The TEG may have a thickness of 2 mm to 50 mm, preferably 2 mm to 30 mm, more preferably 5 mm to 30 mm.

The energy recovery shell 130 may have a multitude of thermoelectric modules.

The TEG may be of flat or annular configuration, as described, for example, in Mengjun Zhang et al., "Performance comparison of annular and flat-plate thermoelectric generators for cylindrical hot source", https://doi.org/10.1016/j.egyr.2021.01.008, 2352-4847/2021, published by Elsevier Ltd. The geometry and/or modularity of the TEG may be dependent on the geometry of the reaction tube 112 and/or on an expected temperature difference.

The apparatus 110 may include at least one energy storage means, shown as an electrical resistor 132 in FIGS. 1a and 1b, for absorption of electrical energy from the energy recovery shell 130 and/or at least one feed to a consumer to feed in electrical energy from the energy recovery shell 130. The consumption may be complete or at least partial. The consumption may include storing. The consumption may include a conversion of the electrical energy to another form of energy. The TEG may be configured such that the electrical energy can be withdrawn directly. The apparatus 110 may therefore be configured such that the temperature directly at the TEG is not too hot and at the same time not too cold. The TEG material used may be stable over a temperature range, especially at temperatures to which the feedstock is heated. Alternatively or additionally, the apparatus 110 may have further elements for protection of the TEG, for example for cooling or precooling. The temperature may thus be adjusted depending on the materials of the TEGs.

The reaction tube 112 and the energy recovery shell 130 may be in a concentric arrangement. The reaction tube 112 may be an inner tube and the energy recovery shell 130 may be arranged further to the outside. For example, the energy recovery shell 130 may be an outer shell of the apparatus 110, as shown in FIGS. 1a, 1b, 2a, 2b, 3a and 3b. However, other designs are also conceivable. For example, the apparatus 110, as shown in FIGS. 5a and 5b, may additionally have a cooling shell 146 that at least partly surrounds all the tubes of the apparatus 110.

The apparatus 110 may comprise a plurality of heating zones 144. For example, the apparatus 110 may have two or more heating zones 144. Each heating zone 144 may comprise at least one heating shell 129. The heating shells 129 may be connected by electrical connections 133. The apparatus 110 may also have regions in which there is no heating of the feedstock, for example mere transport zones. FIGS. 3a and 3b show embodiments with two heating zones 144. For example, the two heating zones may be configured as two reactors or two heat transferers, or one reactor and one heat transferer. With regard to the configuration of the further elements of the apparatus 110 of FIG. 3a, reference may be made to the description of FIG. 1a, and, with regard to configuration of the further elements of the apparatus 110 of FIG. 3b, reference may be made to the description of FIG. 1b. In FIG. 3a, the reaction tube 112 is configured as a metallic cylinder with an external arrangement of the TEG. In FIG. 3b, the reaction tube 112 is configured as a ceramic cylinder with an external arrangement of the TEG.

FIGS. 4*a* to 4*y* show embodiments of the apparatus 110 with a construction kit with tube types for possible reaction tubes 112 and examples of variations. As set out above, the apparatus 110 may have a multitude of reaction tubes 112. The reaction tubes 112 may be of different configuration, for example, with regard to diameter and/or length and/or geometry. The reaction tubes 112 may comprise symmetric and/or asymmetric pipes and/or combinations thereof. In a purely symmetrical configuration, the apparatus 110 may comprise reaction tubes 112 of an identical tube type. The tube type may be characterized at least by one feature selected from the group consisting of: a horizontal configuration of the tube; a vertical configuration of the tube; a length in the inlet (I1) and/or outlet (I2) and/or transition (I3); a diameter in the inlet (d1) and outlet (d2) and/or transition (d3); number n of passes; length per pass; diameter per pass; geometry; surface; and material. The apparatus 110 may comprise a combination of at least two different tube types which are connected in parallel and/or in series. For example, the apparatus may comprise tubes of different lengths in the inlet (I1) and/or outlet (I2) and/or transition (I3). For example, the apparatus 110 may comprise tubes with an asymmetry of the diameters in the inlet (d1) and/or outlet (d2) and/or transition (d3). For example, the apparatus 110 may comprise tubes with a different number of passes. For example, the apparatus may comprise tubes with passes with different lengths per pass and/or different diameters per pass. In principle, any combination of any tube types in parallel and/or in series is conceivable. The apparatus 110 may comprise a multitude of inlets 120 and/or outlets 122 and/or production streams. The reaction tubes 112 of different or identical tube types may be arranged in parallel and/or in series with a plurality of inlets 120 and/or outlets 122. Possible tubes for reaction tubes 112 may take the form of various tube types in the form of a construction kit 134 and may be selected and combined as desired, depending on an end use. Use of tubes of different tube types can enable more accurate temperature control and/or adjustment of the reaction when the feed is fluctuating and/or a selective yield of the reaction and/or an optimized methodology. The tubes may comprise identical or different geometries and/or surfaces and/or materials.

FIGS. 4*a* to 4*y* show possible embodiments by way of example of tube or cylinder types in a schematic diagram. The tube type can be divided into the following categories, with all conceivable combinations of categories being possible:

Category A indicates a course of the reaction tube 112 and/or a tube segment 114, where A1 denotes a tube or cylinder type with a horizontal course and A2 a tube type with a vertical course, i.e. a course perpendicular to the horizontal course.

Category B specifies a ratio of lengths in the inlet (I1) and/or outlet (I2) and/or diameter in the inlet (d1) and/or outlet (d2) and/or transition (d3), with six different possible combinations provided in the construction kit 134.

Category C indicates ratios of lengths in the inlet (I1) and/or outlet (I2) and lengths of passes. All combinations are conceivable here, which are labeled Ci in the present case.

Category F includes the number of electrodes: F1 indicates that a number of electrodes is ≤2, for example in the case of a DC power source or an AC power source. F2 indicates that a number of electrodes is >2, for example for a three-phase power source.

FIGS. 4*b* to 4*y* show inventive working examples of combinations of reaction tubes 112 and/or tube segments 114 of the same and/or different tube type. FIG. 4*b* shows a combination of reaction tubes 112 with three horizontal pipelines 112 and/or pipeline segments 114 of tube type A1, arranged in succession. FIG. 4*c* shows two vertical tubes of tube type A2 connected in parallel and one downstream reaction tube 112 and/or one downstream pipeline segment 114, likewise of tube type A2. FIG. 4*d* shows a multitude of reaction tubes 112 and/or pipeline segments 114 of tube type A2, which are all connected in parallel. FIG. 4*e* shows an embodiment in which a multitude of tube types of category B are arranged in succession. The reaction tubes 112 and/or pipeline segments 114 here may be identical or different tube types of category B, identified by Bi. FIG. 4*f* shows an embodiment with six reaction tubes 112 and/or pipeline segments 114 of category B, with arrangement in two parallel strands of in each case two reaction tubes 112 and/or pipeline segments 114 and with two further reaction tubes 112 and/or pipeline segments 114 connected downstream. FIG. 4*g* shows an embodiment with pipelines 112 and/or pipeline segments 114 of category C, with parallel connection of two pipelines 112 and/or pipeline segments 114 and with one reaction tube 112 and/or one pipeline segment 114 connected downstream. Also possible are mixed forms of categories A, B and C, as shown in FIGS. 4*h* to 4*m*.

As set out above, the apparatus 110 may comprise a multitude of inlets 120 and/or outlets 122 and/or production streams. The reaction tubes 112 and/or pipeline segments 114 of different or identical tube type may be arranged in parallel and/or in series with a plurality of inlets 120 and/or outlets 122, as shown for example in FIGS. 4*k* and 4*m*.

FIGS. 4*n* to 4*p* show illustrative combinations of reaction tubes 112 and/or of pipeline segments 114 of categories A and Fi. FIGS. 4*q* and 4*r* show illustrative combinations of reaction tubes 112 and/or of pipeline segments 114 of categories B and Fi. FIG. 4*s* shows an illustrative combination of reaction tubes 112 and/or of pipeline segments 114 of categories C and Fi. FIG. 4*t* shows an illustrative combination of reaction tubes 112 and/or of pipeline segments 114 of categories A, B, C and Fi. FIG. 4*u* shows an illustrative combination of reaction tubes 112 and/or of pipeline segments 114 of categories A, C and Fi. FIG. 4*v* shows an illustrative combination of reaction tubes 112 and/or of pipeline segments 114 of categories B, C and Fi. FIGS. 4*w* and 4*y* show illustrative combinations of reaction tubes 112 and/or of pipeline segments 114 of categories A, B, C and Fi. FIG. 4*x* shows an illustrative combination of reaction tubes 112 and/or of pipeline segments 114 of categories A, B and Fi. The reaction tubes 112 and/or pipeline segments 114 of different or identical tube types of categories A, B, C and Fi may be arranged in parallel and/or in series with a plurality of inlets 120 and/or outlets 122. Examples of a multitude of inlets 120 and/or outlets 122 and/or production streams are shown in FIGS. 40, 4*p*, 4*r*, 4*s*, 4*v* to 4*y*. The lines may represent a stream of the feedstock, but they may also indicate the electrical connections.

FIGS. 5*a* and 5*b* show embodiments of the apparatus of the invention with a cooling circuit comprising the cooling shell 146. The cooling shell 146 may be set up to at least partly surround the energy recovery shell 130. The cooling shell 146 may be set up for cooling to room temperature or lower. The cooling shell 146 may be set up to establish a temperature difference from a temperature of the reaction tube 112, especially a shell of the reaction tube 112, for example at a defined value. The cooling shell 146 may have at least one cooling medium. With regard to the configuration of the further elements of the apparatus 110 of FIG. 5a, reference may be made to the description of FIG. 1a, and, with regard to the configuration of the further elements of the apparatus 110 of FIG. 5b, reference may be made to the description of FIG. 1b. In FIG. 5a, the reaction tube 112 is configured as a metallic cylinder. In a concentric arrangement on the outside are the TEG surrounded by the cooling shell 146. In FIG. 5b, the reaction tube 112 is configured as a ceramic cylinder. In a concentric arrangement on the outside are the TEG surrounded by the cooling shell 146.

FIGS. 6a, 6b, 7a and 7b show embodiments in which the tubes of the apparatus 110 apart from the reaction tube 112, or the reaction tubes 112, have a rectangular geometry. The reaction tube 112 in these figures too is configured as a hollow cylinder. FIG. 6a shows an embodiment analogously to the apparatus 110 of FIG. 1a. FIG. 6b shows an embodiment analogously to the apparatus 110 of FIG. 2a. FIGS. 7a and 7b show an embodiment with an additional cooling shell 146. FIG. 7a shows an embodiment analogously to the apparatus 110 of FIG. 5a. FIG. 7b shows a configuration analogous to that in FIG. 7a, but with a multitude of reaction tubes 112.

Figure 8A:
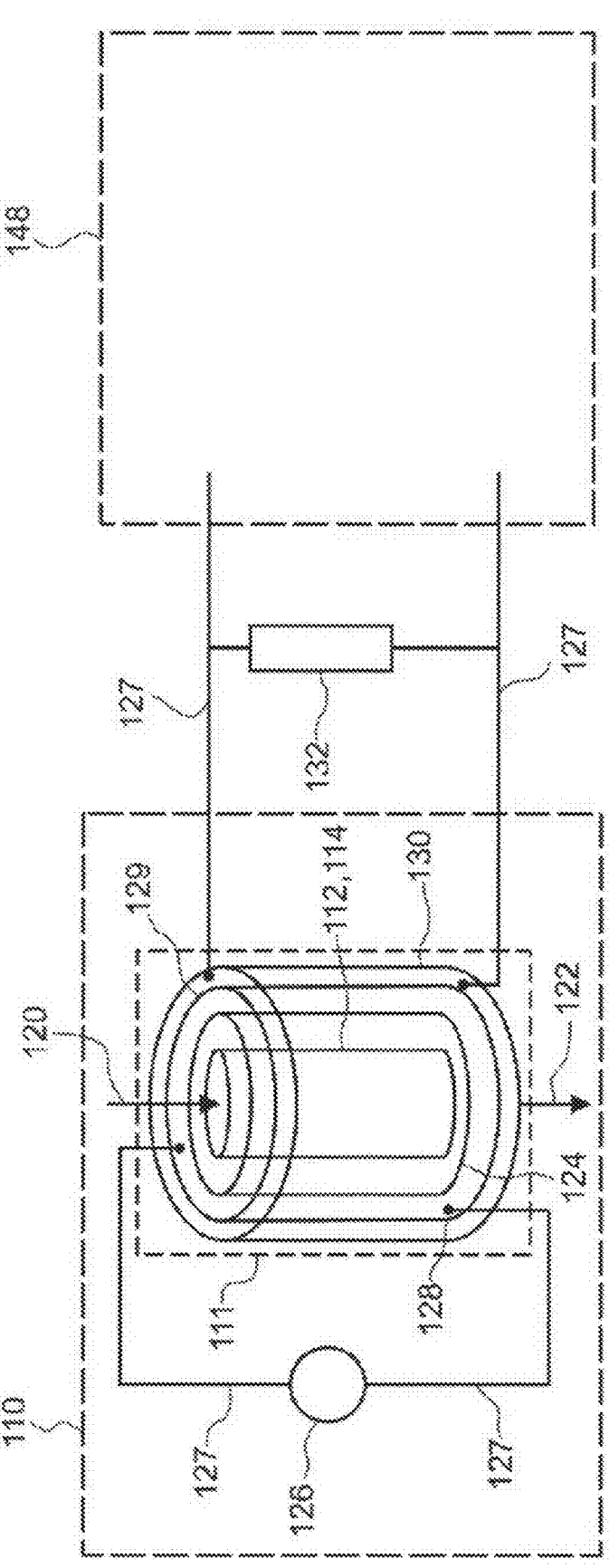
Figure 8B:
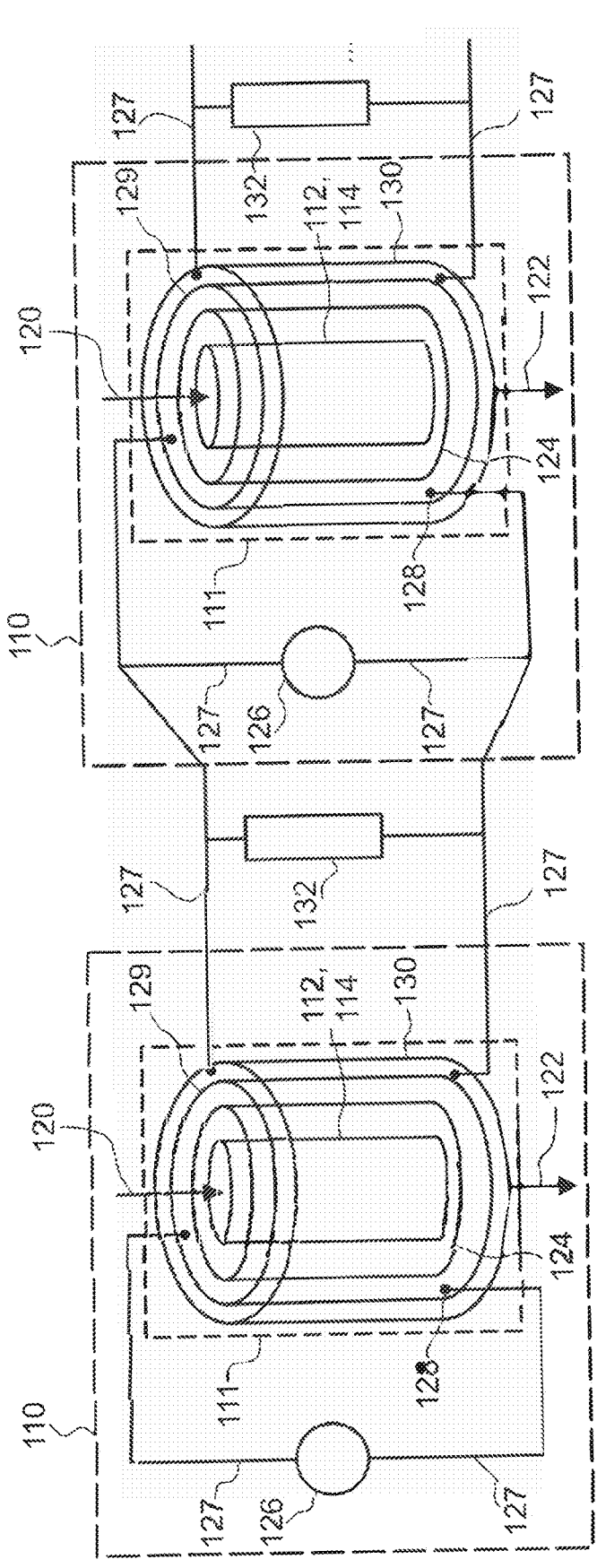
Figure 8C:
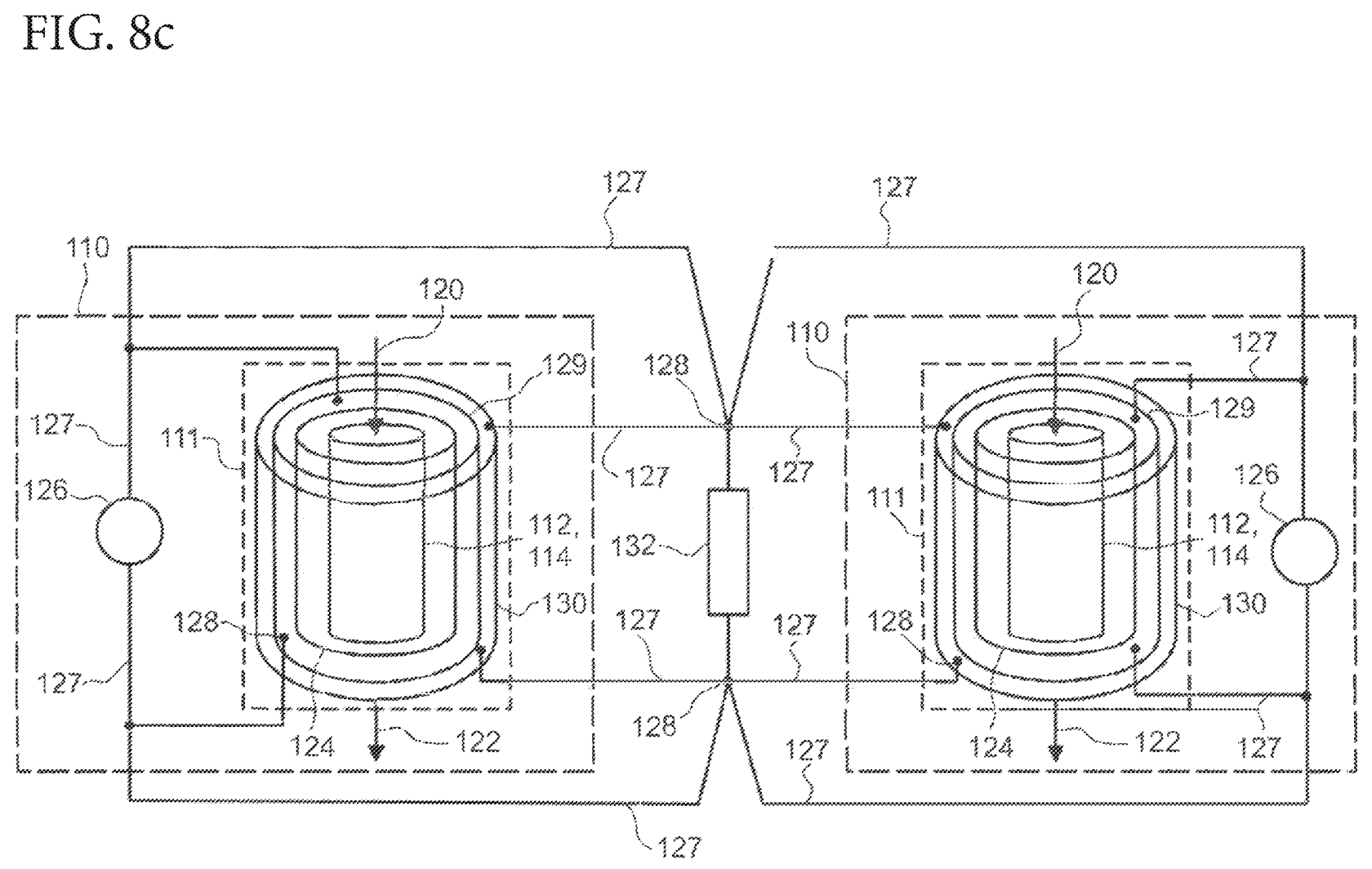
Figure 8D:
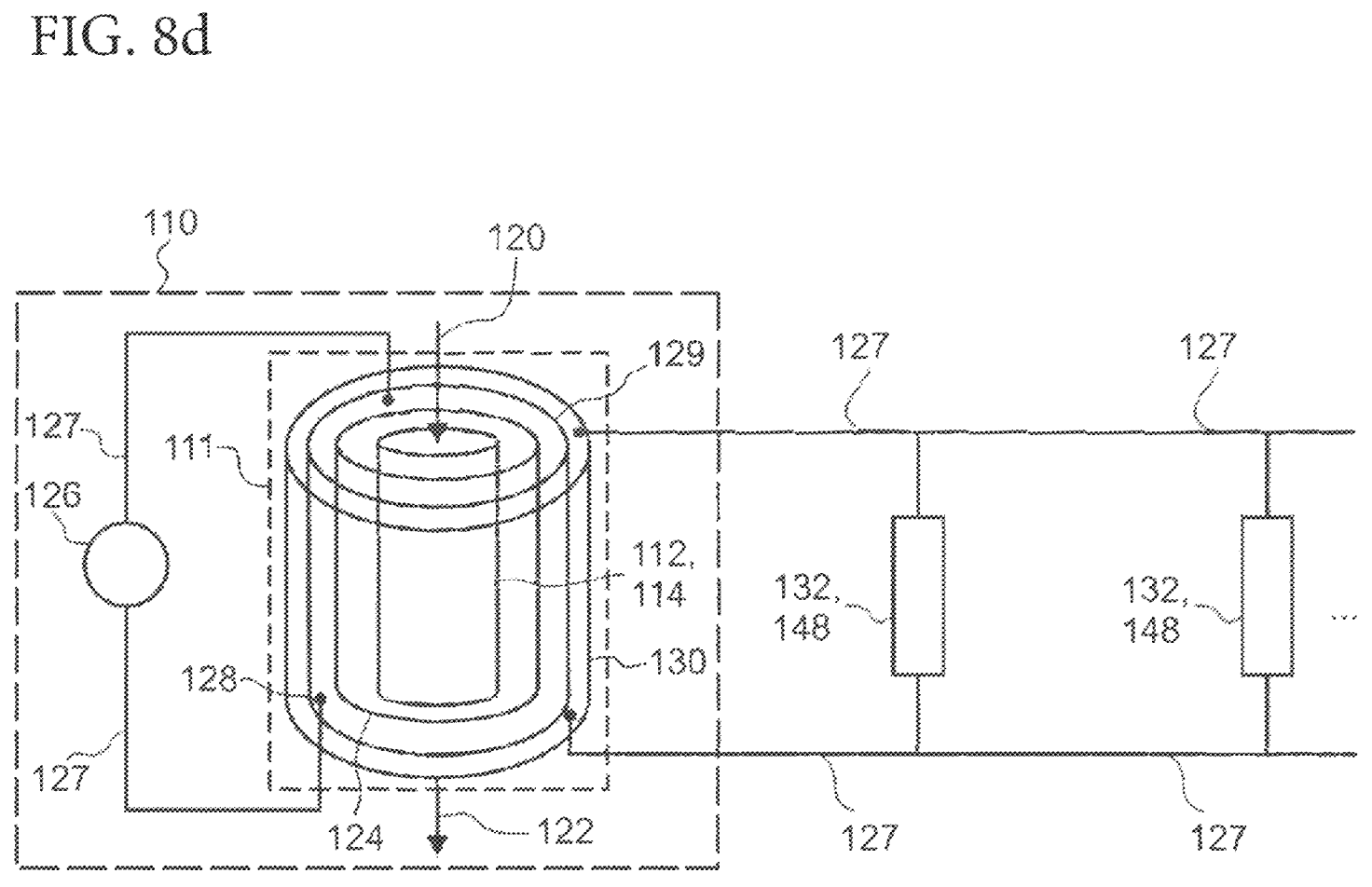

FIGS. 8a to 8d show use examples of the apparatus. Purely by way of example, the apparatus 110 in FIGS. 8a to 8d is shown analogously to the apparatus 110 of FIG. 1a. However, any other described embodiment of the apparatus 110 is conceivable. As set out above, the apparatus 110 may include at least one energy storage means for absorption of electrical energy from the energy recovery shell 130 and/or at least one feed to a consumer to feed in electrical energy from the energy recovery shell 130, shown in schematic form by electrical resistor 132. In FIG. 8a, the consumer is illustrated as an arbitrary consumer 148. The consumer 148 may, for example, be one or more of a charging station, an illumination, another reactor or any other consumer. Examples are heat exchangers, heat transferers, energy storage means, batteries or accumulators. FIG. 8b shows, for example, a consumer in the form of a further apparatus 110 in which the energy can be used to heat the heating shell of the further apparatus 110. FIG. 8c shows a working example of two apparatuses 110 (each analogous to the apparatus 110 of FIG. 1a), in which the apparatuses 110 are each set up to feed recovered energy to the electrical resistor 132. This can be utilized, for example, to heat the respective other reactor. FIG. 8d shows an example with a multitude of identical or different consumers 148 that can be operated at least in part by means of the energy recovered. Other uses of the energy recovered are also conceivable.

LIST OF REFERENCE NUMERALS 110 apparatus
111 reactive space
112 reaction tube
114 tube segment
118 tube system
120 inlot
122 outlet
124 galvanic insulator
126 voltage/power source
127 electrical input and output
128 electrical terminals
129 heating shell
130 energy recovery shell
132 electrical resistor
133 electrical connection
134 construction kit 144 heating zone
146 cooling shell
148 arbitrary consumer

The invention claimed is:

1. An apparatus (110) comprising a multitude of tubes, where at least one of the multitude of tubes is set up as a reaction tube (112) configured for performing at least one chemical reaction and/or at least one partial reaction within the reaction tube, for at least one feedstock to flow through, where the apparatus (110) has at least one energy recovery shell (130) that at least partly surrounds the reaction tube (112), where the at least one energy recovery shell (130) has at least one thermoelectric generator set up to convert heat to electrical energy.

2. The apparatus (110) according to claim 1, wherein the at least one energy recovery shell (130) is set up to convert heat evolved in an exothermic reaction in the reaction tube (112) to electrical energy.

3. The apparatus (110) according to claim 2, wherein the exothermic reaction proceeds during decoking and/or oxidation of deposits in the reaction tube (112).

4. The apparatus (110) according to claim 1, wherein the energy recovery shell (130) includes at least one material having a thermoelectric figure of merit ZT of $\geq 0.5$.

5. The apparatus (110) according to claim 1, wherein the at least one energy recovery shell (130) includes at least one material selected from a group consisting of: lead-tellurium (Pb—Te), at least one telluride, at least one silicone, at least one silicate, at least one silicide, at least one Si—Ge silicide, at least one polymer, at least one ceramic, at least one skutterudite, CoSb3 skutterudite, germanium, at least one semi-Heusler alloy, $Mg_2$ (Sn, Si), $Sr_{1-x}A_xZn_{1-y}Ga_ySn_{1-z}X_z$ (A: Ca, Ba, La, Eu; X: Si, Sb), $Ca_{1-x}A_xAl_{2-y}TM_ySi_2$ (A=Sr, Ba; TM=Mn, zn).

6. The apparatus (110) according to claim 1, wherein the at least one energy recovery shell (130) has a multitude of thermoelectric modules.

7. The apparatus (110) according to claim 1, wherein the reaction tube (112) and the at least one energy recovery shell (130) are in a concentric arrangement, where the reaction tube (112) is an inner tube and the at least one energy recovery shell (130) is arranged further to the outside.

8. The apparatus (110) according to claim 1, wherein the reaction tube (112) includes at least one material selected from a group consisting of: at least one ferritic material, at least one austenitic material, at least one metal, at least one metallic alloy, copper, aluminum, iron, steel alloy, Cr alloy and/or Ni alloy, graphite, carbon, carbide, silicide, or in that the reaction tube (112) is configured as a ceramic tube.

9. The apparatus (110) according to claim 1, wherein the apparatus (110) has at least one current-conducting heating shell (129), where the apparatus has at least one current or voltage source (126) set up to generate an electrical current in the at least one current-conducting heating shell (129), which heats the reaction tube (112) by Joule heat evolved on passage of the electrical current through the at least one current-conducting heating shell (129).

10. The apparatus (110) according to claim 9, wherein the heating shell (129) at least partly surrounds the reaction tube (112), where the at least one current-conducting heating shell (129) directly surrounds the reaction tube (112) and is set up to release its heat generated by current to the reaction tube (112), and/or where the apparatus (110) has at least one galvanic insulator (124), where the at least one galvanic insulator (124) is disposed between the reaction tube (112) and the at least one current-conducting heating shell (129), where the at least one galvanic insulator (124) is set up to galvanically insulate the reaction tube (112) from the at least one current-conducting heating shell (129) and to transmit heat from the at least one current-conducting heating shell (129) to the reaction tube (112).

11. The apparatus (110) according to claim 1, wherein the apparatus has at least one cooling shell (146) set up to at least partly surround the at least one energy recovery shell (130), where theat least one cooling shell (146) is set up for cooling to room temperature or lower.

12. The apparatus (110) according to claim 1, wherein the apparatus (110) is set up to heat the feedstock to a temperature in a range from 200° C. to 1700° C.

13. The apparatus (110) according to claim 1, wherein the feedstock includes at least one medium selected from a group consisting of: air, at least one oxygen-containing medium, water, water vapor, and at least one oxidizing medium.

14. The apparatus (110) according to claim 1, wherein the reaction tube (112) is configured for the at least one feedstock to flow through in order to conduct at least one endothermic reaction.

15. A plant comprising at least one apparatus (110) according to claim 1, wherein the plant is selected from a group consisting of: a plant for performance of at least one endothermic reaction, a plant for heating, a plant for preheating, a steamcracker, a steam reformer, an apparatus for alkane dehydrogenation, a reformer, an apparatus for dry reforming, an apparatus for styrene production, an apparatus for ethylbenzene dehydrogenation, production of acetylene, a cracker, a catalytic cracker, an apparatus for dehydrogenation.

16. A method of recovering electrical energy using an apparatus (110) according to claim 1, said method comprising the following steps:

passing the feedstock through the reaction tube (112);

converting heat evolved in the reaction tube (112) in a chemical reaction to electrical energy with the at least one thermoelectric generator in the at least one energy recovery shell (130).

17. The apparatus (110) according to claim 1, wherein the at least one chemical reaction or at least one partial reaction is an endothermic reaction.

18. The apparatus (11) according to claim 1, wherein the plant is selected from a group consisting of: a steamcracker, a steam reformer, an apparatus for alkane dehydrogenation, an apparatus for styrene production, an apparatus for ethylbenzene dehydrogenation, production of acetylene, a cracker, a catalytic cracker, an apparatus for dehydrogenation.

* * * * *